(12) United States Patent
El-Ghoroury et al.

(10) Patent No.: US 8,912,017 B2
(45) Date of Patent: Dec. 16, 2014

(54) SEMICONDUCTOR WAFER BONDING INCORPORATING ELECTRICAL AND OPTICAL INTERCONNECTS

(75) Inventors: Hussein S. El-Ghoroury, Carlsbad, CA (US); Chih-Li Chuang, San Diego, CA (US); Kameshwar Yadavalli, Carlsbad, CA (US); Qian Fan, Carlsbad, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 109 days.

(21) Appl. No.: 13/463,130

(22) Filed: May 3, 2012

(65) Prior Publication Data

US 2012/0288995 A1    Nov. 15, 2012

Related U.S. Application Data

(60) Provisional application No. 61/484,563, filed on May 10, 2011.

(51) Int. Cl.
*H01L 21/00* (2006.01)
*H01L 21/18* (2006.01)
*H01L 27/146* (2006.01)

(52) U.S. Cl.
CPC ........ *H01L 27/14618* (2013.01); *H01L 21/187* (2013.01); *H01L 27/14683* (2013.01)
USPC ................ 438/24; 438/23; 257/E21.514

(58) Field of Classification Search
CPC .............. H01L 21/187; H01L 21/2007; H01L 21/76251
USPC ......... 438/119, 23, 25; 257/E21.514; 349/45; 385/30, 51, 91
See application file for complete search history.

(56) References Cited

U.S. PATENT DOCUMENTS

| 6,455,398 B1 * | 9/2002 | Fonstad et al. ................ 438/459 |
| 7,335,996 B2 | 2/2008 | Tong |

(Continued)

FOREIGN PATENT DOCUMENTS

EP    1677397    7/2006

OTHER PUBLICATIONS

"Partial International Search Report of the International Searching Authority Dated Jul. 20, 2012, International Application No. PCT/US2012/036621", (Jul. 20, 2012).

(Continued)

*Primary Examiner* — Caridad Everhart
(74) *Attorney, Agent, or Firm* — Blakely Sokoloff Taylor & Zafman LLP

(57) ABSTRACT

Methods for bonding semiconductor wafers requiring the transfer of electrical and optical signals between the bonded wafers and across the bonding interface. The methods incorporate the formation of both electrical and optical interconnect vias within the wafer bonding interface to transfer electrical and optical signals between the bonded wafers. The electrical vias are formed using multiplicity of metal posts each comprised of multiple layers of metal that are interfused across the bonding surface. The optical vias are formed using multiplicity of optical waveguides each comprised of a dielectric material that interfuses across the bonding interface and having an index of refraction that is higher than the index of refraction of the dielectric intermediary bonding layer between the bonded wafers. The electrical and optical vias are interspersed across the bonding surface between the bonded wafers to enable uniform transfer of both electrical and optical signals between the bonded wafers.

11 Claims, 6 Drawing Sheets

(56) References Cited

U.S. PATENT DOCUMENTS

| | | | |
|---|---|---|---|
| 7,387,944 | B2 | 6/2008 | Tong et al. |
| 7,485,968 | B2 | 2/2009 | Enquist et al. |
| 7,553,744 | B2 | 6/2009 | Tong et al. |
| 7,622,324 | B2 | 11/2009 | Enquist et al. |
| 7,623,560 | B2 | 11/2009 | El-Ghoroury et al. |
| 7,767,479 | B2 | 8/2010 | El-Ghoroury et al. |
| 7,829,902 | B2 | 11/2010 | El-Ghoroury et al. |
| 8,049,231 | B2 | 11/2011 | El-Ghoroury et al. |
| 8,243,770 | B2 | 8/2012 | El-Ghoroury et al. |
| 2001/0014514 | A1* | 8/2001 | Geusic ............ 438/455 |
| 2003/0114017 | A1* | 6/2003 | Wong et al. ........ 438/778 |
| 2003/0182794 | A1* | 10/2003 | Fonstad et al. ...... 29/744 |
| 2003/0186521 | A1 | 10/2003 | Kub et al. |
| 2004/0235266 | A1 | 11/2004 | Tong |
| 2005/0053319 | A1* | 3/2005 | Doan ................ 385/14 |
| 2007/0281484 | A1* | 12/2007 | Ishibashi et al. .... 438/692 |
| 2008/0087875 | A1* | 4/2008 | Fan et al. ........... 257/13 |
| 2008/0187757 | A1 | 8/2008 | Tong |
| 2009/0068831 | A1 | 3/2009 | Enquist et al. |
| 2009/0086170 | A1* | 4/2009 | El-Ghoroury et al. .... 353/38 |
| 2009/0278998 | A1 | 11/2009 | El-Ghoroury et al. |
| 2010/0003777 | A1 | 1/2010 | El-Ghoroury et al. |
| 2010/0066921 | A1 | 3/2010 | El-Ghoroury et al. |
| 2010/0220042 | A1 | 9/2010 | El-Ghoroury et al. |
| 2010/0276776 | A1 | 11/2010 | Lee et al. |
| 2011/0117726 | A1* | 5/2011 | Pinnington et al. ...... 438/458 |
| 2012/0033113 | A1 | 2/2012 | El-Ghoroury et al. |

OTHER PUBLICATIONS

Alexe, M., et al., "Wafer Bonding Applications and Technology", Springer, (2004), pp. 327-415.

Chen, P. H., et al., "Amorphous Si/Au wafer bonding", *Applied Physics Letters*, 90, (2007), pp. 132120-1 to 132120-3.

Choi, H. W., et al., "High-Resolution 128×96 Nitride Microdisplay", *IEEE Electron Device Letters*, vol. 25, No. 5, (May 2004), pp. 277-279.

Chuang, Ricky W., et al., "High-temperature non-eutectic indium-tin joints fabricated by a fluxless process", *Thin Solid Films*, 414, (2002), pp. 175-179.

Fan, Z. Y., et al., "III-nitride micro-emitter arrays: development and applications", *J. Phys. D: Appl. Phys.*, 41, (2008), pp. 1-12.

Gong, Z., et al., "Efficient flip-chip InGaN micro-pixellated light-emitting diode arrays: promising candidates for micro-displays and colour conversion", *J. Phys. D: Appl. Phys.*, 41, (2008), pp. 1-6.

Hou, M. M., et al., "Low Temperature Transient Liquid Phase (LTTLP) Bonding for Au/Cu and Cu/Cu Interconnections", *Journal of Electronic Packaging*, vol. 114, (Dec. 1992), pp. 443-447.

Jang, Eun-Jung, et al., "Effect of Wet Pretreatment on Interfacial Adhesion Energy of Cu-Cu Thermocompression Bond for 3D IC Packages", *Journal of Electronic Materials*, vol. 38, No. 12, (2009), pp. 2449-2454.

Kim, Jongsung, et al., "Fluxless Sn-Ag bonding in vacuum using electroplated layers", *Materials Science and Engineering A*, 448, (2007), pp. 345-350.

Ko, Cheng-Ta, et al., "Water-level bonding/stacking technology for 3D integration", *Microelectronics Reliability*, 50, (2010), pp. 481-488.

Lü, J.-Q., et al., "Stacked Chip-to-Chip Interconnections Using Wafer Bonding Technology with Dielectric Bonding Glues", *Proceedings of the 2001 Interconnect Technology Conference*, (2001), pp. 219-221.

Ramm, P., "Three dimensional metallization for vertically integrated circuits", *Microelectronic Engineering*, 37/38, (1997), pp. 39-47.

Schneider, H., et al., "Dual-band QWIP focal plane array for the second and third atmospheric windows", *Infrared Physics & Technology*, 47, (2005), pp. 53-58.

Tong, Q.-Y., et al., "Room temperature $SiO_2/SiO_2$ covalent bonding", *Applied Physics Letters*, 89, (2006), pp. 042110-1 to 042110-3.

Tong, Q. Y., et al., "Semiconductor Wafer Bonding Science and Technology", Wiley, (1999), pp. 203-261.

Wang, Pin J., et al., "Fluxless Bonding of Large Silicon Chips to Ceramic Packages Using Electroplated Eutectic Au/Sn/Au Structures", *Journal of Electronic Materials*, vol. 38, No. 10, (2009), pp. 2106-2111.

Yu, Da-Quan, et al., "The role of Ni buffer layer on high yield low temperature hermetic wafer bonding using In/Sn/Cu metallization", *Applied Physics Letters*, 94 (2009), pp. 034105-1 to 034105-3.

"International Search Report and Written Opinion of the International Searching Authority Dated Oct. 16, 2012, International Application No. PCT/US2012/036621", (Oct. 16, 2012).

"Communication Dated Jan. 24, 2014; European Patent Application No. 12721390.8", (Jan. 24, 2014).

* cited by examiner

100

A. Direct Fusion Bonding

B. Aligned Fusion Bonding

C. Eutectic Bonding

D. Adhesive (BCB) Bonding

SEMICONDUCTOR WAFER BONDING INCORPORATING ELECTRICAL AND OPTICAL INTERCONNECTS

CROSS-REFERENCE TO RELATED APPLICATIONS

This application claims the benefit of U.S. Provisional Patent Application No. 61/484,563 filed May 10, 2011.

BACKGROUND OF THE INVENTION

1. Field of the Invention

The present invention relates to the bonding of semiconductor III-V photonic wafers and CMOS electronics wafers in order to realize solid state light devices in which light and electrical signals are transferred between the bonded wafers.

2. Prior Art

The advent of 3D-IC and solid state light technologies is making it possible to integrate arrays of light emitters or detectors patterned from III-V material and bonded to a CMOS control circuit (see U.S. Pat. Nos. 7,623,560, 7,767,479 and 7,829,902, as well as G. Y. Fan, et al, III-nitride micro-emitter arrays: development and applications, J. Phys D: Appl. Phys. 41 (2008), Z. Gong, et al, Efficient flip-chip InGaN micro-pixellated light-emitting diode arrays: promising candidates for micro-displays and colour conversion, J. Phys D: Appl. Phys. 41 (2008), and H. Schneider, et al, Dual band QWIP focal plane array for the second and third atmospheric windows, Infrared Physics & Technology, 47 (2005) 53-58). In particular, recent advances in 3-dimensional integrated circuits (3D-IC) are making it possible to integrate multi-layer optoelectronics devices comprising relatively high resolution arrays of light emitters (see U.S. Pat. Nos. 7,623,560, 7,767,479 and 7,829,902, as well as G. Y. Fan, et al, III-nitride micro-emitter arrays: development and applications, J. Phys D: Appl. Phys. 41 (2008) and Z. Gong, et al, Efficient flip-chip InGaN micro-pixellated light-emitting diode arrays: promising candidates for micro-displays and colour conversion, J. Phys D: Appl. Phys. 41 (2008)) or light detectors (see H. Schneider, et al, Dual band QWIP focal plane array for the second and third atmospheric windows, Infrared Physics & Technology, 47 (2005) 53-58) (collectively referred to as "photonic" arrays). Evidence of such trend are the devices described in G. Y. Fan, et al, III-nitride micro-emitter arrays: development and applications, J. Phys D: Appl. Phys. (2008) which are micro-LED array devices comprising single wavelength device pixels patterned on III-V compound semiconductor layers such as GaN driven passively and packaged in a PGA package using wire-bonding. In G. Y. Fan et al., hybrid integration of the III-V emitter array with a silicon control IC using flip-chip bonding is used. Similar light emitter array devices of single color 8×8, 16×16 and 64×64 pixels are fabricated and integrated with CMOS using flip-chip bonding (see G. Y. Fan, et al, III-nitride micro-emitter arrays: development and applications, J. Phys D: Appl. Phys. 41 (2008) and Z. Gong, et al, Efficient flip-chip InGaN micro-pixellated light-emitting diode arrays: promising candidates for micro-displays and colour conversion, J. Phys D: Appl. Phys. 41 (2008)). These types of micro-emitter array devices can use flip-chip and wire bonding techniques because their photonic elements (pixels) size are relatively large (a few hundred microns) which result in low electrical interconnect density that make it possible to use such techniques for bonding the III-V light emitting array to the control CMOS.

Of particular interest is the ultra high pixel density emissive micro-display device described in U.S. Pat. Nos. 7,623,560, 7,767,479 and 7,829,902. These types of devices are typically an array of micro dimensional solid state light emitting elements that are formed from one type of photonic materials, such as III-V material, and integrated using 3D-IC techniques to a micro electronic circuit array that is used for coupling electrical signals in and out of the photonic array (see U.S. Pat. Nos. 7,623,560, 7,767,479 and 7,829,902, as well as G. Y. Fan, et al, III-nitride micro-emitter arrays: development and applications, J. Phys D: Appl. Phys. 41 (2008), Z. Gong, et al, Efficient flip-chip InGaN micro-pixellated light-emitting diode arrays: promising candidates for micro-displays and colour conversion, J. Phys D: Appl. Phys. 41 (2008), and H. Schneider, et al, Dual band QWIP focal plane array for the second and third atmospheric windows, Infrared Physics & Technology, 47 (2005) 53-58). For the majority of these types of devices, wafers of the photonic material from which the photonic array elements are formed are typically bonded to a micro circuit array wafer, using one or more of the wafer bonding techniques such as those described in M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999, with the electrical signals being transferred between the bonded photonic and electronics wafers using electrical interconnect via array such as that described in M. Alexe and U. Güsele, pp. 177-184. The wafer bonding interface surface required in the fabrication of these types of devices would therefore involve embedding an array of electrical vias within the bonding interface surface between the photonic and electronic wafers. Furthermore, when the elements of photonic array and its associated electronic circuit elements are micro dimensional in size (i.e., few microns in size such as with the case of the device described in U.S. Pat. Nos. 7,623,560, 7,767,479 and 7,829,902), the density of the interconnect vias across the bonding interface can reach more than one million interconnect vias per square centimeter.

Wafer bonding for these types of devices would also include means of achieving adhesion (bonding) across the wafer bonding interface surface including the cross section of the interconnect vias as well. The bonding across the major part of the wafer interface surface is typically achieved using an intermediary layer that can be fused across the interface surfaces. For the type of device mentioned earlier, wafer bonding is achieved through fusion bonding of a highly polished intermediary layer across the bonding interface of the wafers that can be accomplished either at room temperature (see U.S. Pat. Nos. 7,622,324, 7,553,744, 7,485,968 and 7,387,944) or at elevated temperature and pressure conditions (see M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999). For the metal interconnects, via to via solid-state diffusion bonding across the bonding surface is typically achieved by interfusion of the vias cross sections which includes the use of elevated temperature annealing of the bonded wafers which leverages the strength of the bonding across the interface surface achieved by the fused intermediary layers and the elevated temperature of the annealing to create the thermal compression conditions needed to interfuse the electrical interconnect vias across the bonding surface of the two wafers (see U.S. Pat. No. 7,622,324 and M. Alexe and U. Güsele, Wafer Bonding Applications and Technology, pp 327-415, Springer 2004).

U.S. Pat. Nos. 7,623,560, 7,767,479 and 7,829,902 describe an emissive micro-display device that is comprised of multiple layers of patterned solid state light emitting material which are bonded into a stack and are collectively bonded to a CMOS micro electronic circuit array. The bonded stack of patterned solid state light emitting material form an array of multi-color light emitting pixels that is controlled by a CMOS micro electronic circuit layer to which the stack of patterned and bonded solid state light emitting material is bonded. The realization of device structures such as that described in U.S. Pat. Nos. 7,623,560, 7,767,479 and 7,829,902 requires bonding of photonic to photonic wafers as well as bonding of silicon (Si) based CMOS to photonic wafers that include the transfer of both electrical as well as light signals across the bonding surfaces of the bonded semiconductor wafers. No prior art reference was found that describes methods for the bonding semiconductor wafers that incorporate the transfer of both electrical and light signals across the bonded wafer interface.

FIGS. 1A-1D are illustrations of typical prior art semiconductor wafer bonding techniques including direct fusion bonding (FIG. 1A), aligned fusion bonding (FIG. 1B), eutectic bonding (FIG. 1C), BenzoCycloButene (BCB) polymer adhesive bonding (FIG. 1D). Of particular interest is FIG. 1B which illustrates the aligned fusion bonding of wafers that incorporate electrical interconnect vias across the bonding surface described in the prior art (see U.S. Pat. Nos. 7,622,324, 7,553,744, 7,485,968 and 7,387,944, as well as M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999). In this wafer bonding technique prior to bonding of the two wafers, which are typically silicon (Si) based, alignment marks are included within each wafer having sufficient feature definition to enable precise alignment of the two wafers to less that 10% of the diameter of the interconnect vias. Prior to bonding, each of the two wafers are separately planarized using chemical mechanical bonding (CMP) techniques. An intermediate bonding layer typically of dielectric material, which is typically silicon oxide ($SiO_2$), is deposited on the planarized surface of the two wafers separately. Interconnect metal via posts are then formed on the bonding surface of the each of the two wafers typically using a single electrically conductive metal such as nickel. The formed bonding interface surface is then polished using CMP to within less than half nanometer of roughness, surface activated and the wafers are then aligned using the incorporated alignment marks with their bonding interface surface facing each other and brought into contact. Appropriate levels of pressure and elevated temperature are applied to increase the bonding strength across the bonding surface of the two wafers. Depending on the surface roughness achieved on the bonding interface surface, at the end of this process the dielectric intermediary layers deposited on the surface of each of the two wafers will fuse together across the wafers bonding interface surface. However, the wafer polishing and surface activation processes could cause the interconnect vias interface surface to be recessed below the dielectric surface which would result in the presence of a gap between the opposing vias across the wafer bonding interface surface. The presence of such gaps between the interconnect vias could cause excessive level of electrical resistance between the corresponding electrical circuits of the bonding wafers. In order to minimize the electrical resistance across the interconnect vias, the bonded wafers are subjected to further annealing at elevated temperature to cause the aligned vias to expand and interfuse together across the bonding interface.

Several aspects of prior art bonding processes (see U.S. Pat. Nos. 7,622,324, 7,553,744, 7,485,968 and 7,387,944) make it more effective for bonding wafers having substantially similar thermal expansion characteristics but substantially less effect for bonding wafers with differing thermal expansion characteristics, such as the case when a wafer made from III-V material and possibly grown on substrates such as sapphire needs to be bonded to a Si wafer. When the thermal expansion characteristics of the two wafers to be bonded are substantially different, excessive and prolonged elevated temperature annealing after the bonding intermediary layers of the respective wafers have been fused together as described in U.S. Pat. Nos. 7,622,324, 7,553,744, 7,485,968 and 7,387,944 would be terminal to the bonded wafers and would likely cause the achieved bonding to fail causing debonding of the intermediary layers. This means that the prior art prior art bonding methods (see U.S. Pat. Nos. 7,622,324, 7,553,744, 7,485,968 and 7,387,944) are not likely to be effective in the bonding of wafers having substantially dissimilar thermal expansion characteristics such as the case when a wafer made from III-V material needs to be bonded to a Si wafer such as described in U.S. Pat. Nos. 7,623,560, 7,767,479 and 7,829,902.

Fusion bonding (see M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999) in general and low temperature fusion bonding in particular (see Q. Y. Tong and U. Güsele, pp. 49-101 and U.S. Pat. Nos. 7,622,324, 7,553,744, 7,485,968 and 7,387,944) of wafers requires pre-bonding planarization of the wafers to be bonded to a highly stringent level that can reach substantially less than one nanometer root mean square (RMS) across the wafer surface. However, wafers made from III-V material characteristically have a certain amount of bow that can be substantially higher than one micron across the wafer surface. Such an excessive level of wafer bow would make very difficult, if not practically impossible, to make use of the prior art wafer bonding methods described in U.S. Pat. Nos. 7,622,324, 7,553,744, 7,485,968 and 7,387,944 for the bonding of a wafer made from III-V material to a Si wafer such as those described in U.S. Pat. Nos. 7,623,560, 7,767,479 and 7,829,902 and H. Schneider, et al, Dual band QWIP focal plane array for the second and third atmospheric windows, Infrared Physics & Technology, 47 (2005) 53-58.

The emissive micro-display (imager) device described in U.S. Pat. Nos. 7,623,560, 7,767,479 and 7,829,902 represents the state of the art in emissive micro-displays and uses III-V compound semiconductor materials as emissive layers promising high brightness, power efficiency, multi-color, long lifetime and highly reliable micro-displays with color purity for use in a variety of applications including imaging, projection, and medical among other uses. The emissive device in U.S. Pat. Nos. 7,623,560, 7,767,479 and 7,829,902 is comprised of a large array (more than one million per square centimeter) of solid state light emitting pixels, either laser diodes (LDs) or light emitting diodes (LEDs), depending on current injection conditions, integrated onto a Si-based CMOS comprised of a reciprocating array of digital control logic circuits using 3D-IC technology. The array of digital control micro circuits of the imager device described in U.S. Pat. Nos. 7,623,560, 7,767,479 and 7,829,902 would typically be manufactured using standard Si-based CMOS technology whereby a multiplicity of digital control micro circuit arrays are formed as individual dies that covers the surface of a CMOS wafer. The emissive pixel array of the imager device described in U.S. Pat. Nos. 7,623,560, 7,767,479 and 7,829,902 would typically be manufactured by patterning a multiplicity of pixel arrays, that correspond with the dies of the CMOS wafer, onto the surface of a wafer made from III-V compound materials such as InGaN/sapphire or AlGaInP/GaAs, for example, depending on the required wavelength of the light to be emitted. The imager device described in U.S. Pat. Nos. 7,623,560, 7,767,479 and 7,829,902 would typically be manufactured by aligned bonding of the CMOS wafer, acting as a host wafer, and the patterned III-V wafer to ultimately create a wafer stack that is comprised of a multiplicity of device dies that covers the surface of the bonded wafer pair. As described in U.S. Pat. Nos. 7,623,560, 7,767,479 and 7,829,902, after the growth substrate of the III-V wafer is removed either by epitaxial lift-off (ELO) or laser lift-off (LLO) techniques, the resultant III-V/CMOS wafer stack would become the host wafer upon which a second and third patterned III-V wafer are sequentially bonded to ultimately create a stack of multiple patterned III-V layers bonded on the top of the CMOS wafer. The ultimate multi-color imager device described in U.S. Pat. Nos. 7,623,560, 7,767,479 and 7,829,902 would be comprised of multiple patterned (pixelated) III-V layers stacked on top of the CMOS control logic array making the device able to emit any combination of light with multiple wavelengths from each pixel under the control of its associated CMOS logic circuit.

A distinctive aspect of the multi-color imager device described in U.S. Pat. Nos. 7,623,560, 7,767,479 and 7,829,902 is that its operation requires electrical signals to be coupled from the CMOS logic circuit of each pixel to each of the individual solid state light emitting layers of the multi layer stack. Furthermore, for the multi-color light to be emitted from the top surface of that imager device, light would have to be coupled from the layer where it is generated through the stack of layers above it. As described in U.S. Pat. Nos. 7,623,560, 7,767,479 and 7,829,902, within each of the light generating layers of the stack, light would be propagated (coupled) through multiplicity of vertical waveguides that are distributed across each layer. Meaning that the multi-color imager device described in U.S. Pat. Nos. 7,623,560, 7,767,479 and 7,829,902 would, in addition to requiring that electrical signals be coupled through each of the individual light emitting layers of the multi layer stack, also require that light be coupled through each of the individual solid state light emitting layers of the multi layer stack and their respective bonding layers as well. This requirement would imply that the bonding of the light generating (photonic) wafers used in the fabrication of the multi-color imager device described in U.S. Pat. Nos. 7,623,560, 7,767,479 and 7,829,902 would have to incorporate means for the transfer of both electrical as well as light signals between the stacked layers that would form the ultimate multi-layer imager device. No prior art was found that describes wafer bonding that incorporates means of the bonding of multiple wafers that incorporate means for the transfer of light signals between the bonded wafers.

As explained earlier, the wafer bonding described in the prior art (see U.S. Pat. Nos. 7,622,324, 7,553,744, 7,485,968 and 7,387,944) that incorporates electrical interconnect vias relies on the use of post fusion bonding elevated temperature annealing in order to interfuse the incorporated metal interconnect vias across the bonding surface of the bonded wafers. In order to close the gap between the surface of the interconnect vias at each wafer bonding surface that is formed mostly due to the uneven response of the via metal and intermediary dielectric layer to the pre-bonding wafer chemical mechanical planarization (CMP) and the bonding surface activation steps, the electrical interconnect vias must contain enough volumetric size of metal to allow the metal expansion at the elevated temperature of the annealing step to fill in the formed gap between the facing vias across the bonding surface of the wafers. Depending on the geometry of the formed electrical vias, that requirement would dictate that the interconnect vias be more than 1.5 micron in height and more than 3 micron in diameter. Such a height for the electrical interconnect vias would be of no critical consequence when only electrical signals need to be transferred across the wafer bonding interface. However, when the wafer bonding surface needs to transfer light in addition to electrical signals the situation becomes vastly different since the excessive height of the interconnect vias would consequently cause excessive thickness of the intermediary bonding layer between the two wafers which could cause undesired attenuation (through absorption) of the light being transferred between the bonded wafers (layers) especially since the resultant thickness of the bonding between the two wafers is double the thickness of the intermediary bonding layers formed at the bonding side of each of the two wafers. Therefore prior art wafer bonding (see U.S. Pat. Nos. 7,622,324, 7,553,744, 7,485,968 and 7,387,944) that incorporates electrical interconnect vias in which the height of the electrical vias as a design parameter, and consequently the thickness of the bonding intermediary layer, does not take into account the adverse effects of the attenuation of light signal being transferred across the wafer bonding surface due to the resultant thickness of the intermediary bonding layers.

One of the most important virtues of the multi-color imager device described in U.S. Pat. Nos. 7,623,560, 7,767,479 and 7,829,902 is that it eliminates most of the inefficiencies associated with present day spatial light modulators used in typical displays, thus making it possible to generate sufficient brightness of multi-color light to the display viewer from a very small pixel having a typical size of (10×10) micron or smaller. An important aspect of the fabrication of the multi-color imager device described in U.S. Pat. Nos. 7,623,560, 7,767,479 and 7,829,902, therefore, is achieving sufficiently small pixel size (pixel pitch~10 micron or less) that would enable such device to cost effectively realize a multi-color emission that can be used for a multiplicity of applications. Translated into the wafer bonding requirement, this level of multi-color pixel pitch would require wafer bonding interconnect via array with a density in the range of 4 million vias per square centimeter or higher; meaning~5 micron electrical interconnect via pitch or lower. No prior art exists that describes methods for wafer bonding at such ultra high interconnect density especially incorporating means for the transfer of both light and electrical signals transfer between the bonded wafers across the bonding layer.

The excessive diameter of the electrical interconnect vias in prior art wafer bonding methods (see U.S. Pat. Nos. 7,622,324, 7,553,744, 7,485,968 and 7,387,944) would be of no critical consequences when the density of the electrical interconnects is well below $10^6/cm^2$ such as the case in many 3D-IC comprised of an electronics CMOS wafer being bonded to another electronics CMOS wafer. However, when the wafer bonding surface needs to incorporate multiple electrical vias for each few micron optical element (pixel) such as the case of the imager described in U.S. Pat. Nos. 7,623,560, 7,767,479 and 7,829,902, excessive electrical vias diameter become a determinant for achieving high density optical element (pixel) pitch. Therefore, prior art wafer bonding methods (see U.S. Pat. Nos. 7,622,324, 7,553,744, 7,485,968 and 7,387,944) in which the diameter of the electrical interconnect vias as a design parameter, and consequently the achievable density of the interconnect vias, do not take into account the limitation such a parameter places on the pixel pitch that can be achieved when such wafer bonding methods are used in the bonding of the semiconductor wafers of ultra high optical element (pixel) density optoelectronics devices such as those described in U.S. Pat. Nos. 7,623,560, 7,767,479 and 7,829,902.

As stated earlier, the device described in U.S. Pat. Nos. 7,623,560, 7,767,479 and 7,829,902 requires electrical interconnect via density in excess of $4 \times 10^6/cm^2$. The limitation of the existing prior art (see U.S. Pat. Nos. 7,622,324, 7,553,744, 7,485,968 and 7,387,944 and M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999) is that at such a fine via pitch the amount of metal in the formed fine pitch interconnect via would not be sufficient to close the gap between the vias using post bonding elevated temperature annealing unless the via height and diameter, and consequently the intermediary bonding layers thickness is substantially increased to become significantly larger than 1.5 micron, which would result in interconnect vias having a fairly high aspect ratio (expressed in terms of the ratio of the via height to its diameter). As explained earlier, such an increase in the intermediary bonding layer thickness will become even more detrimental to the transfer of light signals between the bonded wafers for the case when light has to be transferred across the bonding interface. Furthermore, when the interconnect vias aspect ratio becomes too high, the expansion of the interconnect vias during the elevated temperature annealing step required to interfuse the interconnect vias across the wafer bonding surface could result in the creation of gaps along the interconnect via height that ultimately be detrimental to achieving the low electrical resistance critically needed to transfer electrical signal between the bonded layers.

In order to achieve multi-color and ultra high pixel density capabilities, the device described in U.S. Pat. Nos. 7,623,560, 7,767,479 and 7,829,902 is composed of multiple patterned III-V material based photonic layers, one for each primary color wavelength of interest, which are bonded to each other and to a Si CMOS wafer which has the required drive circuitry. Due to the ultra high pixel density sought after in U.S. Pat. Nos. 7,623,560, 7,767,479 and 7,829,902 and the resultant ultra high interconnect density, which can be higher than $4 \times 10^6/cm^2$, bonding techniques such as flip-chip, conventional eutectic bonding and the like are not a feasible way to realize multi-color emissive micro-display device described in U.S. Pat. Nos. 7,623,560, 7,767,479 and 7,829,902. Furthermore, due to the stacking of multiple light emitting layers to the control circuitry CMOS wafer, the emissive micro-display device described in U.S. Pat. Nos. 7,623,560, 7,767,479 and 7,829,902 would require the transfer of both electrical signals as well as light between its constituent bonded layers. Prior art bonding methods such as those described in U.S. Pat. Nos. 7,622,324, 7,553,744, 7,485,968 and 7,387,944, and M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999 are mostly suited for bonding silicon based wafers and as such suffer from severe deficiencies when used to bond wafers of dissimilar materials such as photonic wafers that are typically fabricated using III-V materials and control circuitry wafers that are typically fabricated using silicon (Si) based CMOS.

Three dimensional integrated circuits (3D-IC) with high density and multi-functional capability are recognized as the next revolution in the semiconductor device technology (see International Technology Roadmap for Semiconductors, www.itrs.net). To achieve 3D-IC integration, fabrication schemes based on chip-chip, chip-wafer or wafer-wafer bonding methods were recently developed (see U.S. Pat. Nos. 7,622,324, 7,553,744, 7,485,968 and 7,387,944, and M. Alexe and U. Güsele, Wafer Bonding Applications and Technology, pp 327-415, Springer 2004 and Q. Y. Tong and U. Güsele, Semiconductor Wafer Bonding Science and Technology, pp 203-261, Wiley 1999). Of these different fabrication schemes, direct wafer-wafer bonding enables maximum throughput, and thus reduced cost. The important wafer level bonding techniques in use for 3D-IC integration are direct fusion bonding (FIG. 1A), aligned fusion bonding (FIG. 1B), eutectic bonding (FIG. 1C), and adhesion bonding (FIG. 1D) (see C-T. Ko, et al, Wafer-level bonding/stacking technology for 3D integration, Microelectronics Reliability 50 (2010) 481-488). Each of these wafer bonding technologies offers certain benefits and challenges. Among the technologies identified above, aligned fusion bonding is a viable bonding technique for the fabrication of the device described in U.S. Pat. Nos. 7,623,560, 7,767,479 and 7,829,902. Direct and aligned fusion bonding (FIG. 1A & B) allow for wafer-to-wafer bonding utilizing bond formation between two dielectric layers on the respective wafers. Prior art U.S. Pat. Nos. 7,622,324, 7,553,744, 7,485,968 and 7,387,944 describe aligned fusion bonding of silicon based wafers (primarily Si—Si or using $SiO_2$—$SiO_2$ bond formation) that incorporates only interconnect electrical vias to transfer electrical signals across the bonding interface of the bonded wafers. In addition, the electrical interconnect density that can be achieved by such wafer bonding techniques is limited to substantially less than one million electrical interconnects per square centimeter. In the vast amount of work on wafer bonding for 3D-IC integration (the various references cited in C-T. Ko, et al, Wafer-level bonding/stacking technology for 3D integration, Microelectronics Reliability 50 (2010) 481-488 and U.S. Pat. Nos. 7,622,324, 7,553,744, 7,485,968 and 7,387,944, none of the described wafer bonding techniques are suitable for the integration of the optoelectronic devices such as that conceived in U.S. Pat. Nos. 7,623,560, 7,767,479 and 7,829,902, in that these techniques do not include provisions for the transfer of both electrical and light signals across the bonded layers of an optoelectronic device that incorporates an array of ultra high density photonic elements (pixels).

Given the aforementioned drawbacks of current semiconductor wafer bonding methods when used for bonding semiconductor photonic III-V wafers and electronics CMOS wafers, overcoming such weaknesses is certain to have a significant commercial value especially in view of the growing demand for solid state light based displays. It is therefore an objective of this invention to provide semiconductor methods for bonding photonic III-V wafers to electronics CMOS wafers whereby the wafer bonding interface incorporates means for the transfer of both electrical as well as optical signals across the bonding interface. Said semiconductor wafer bonding methods will incorporate means to alleviate the detrimental effects on wafer bonding that could be caused by the mismatch in thermal expansion of III-V and conventional CMOS materials. Furthermore, said semiconductor wafer bonding methods will incorporate means to overcome the limiting effects the height and diameter of the electrical interconnect vias have on the performance of semiconductor optoelectronics devices fabricated using wafer bonding. Additional objectives and advantages of this invention will become apparent from the following detailed description of a preferred embodiment thereof that proceeds with reference to the accompanying drawings.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION OF THE PREFERRED EMBODIMENTS

Figure 1A:
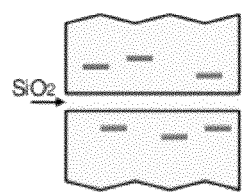
FIG. 1A illustrates vertical cross sectional view of wafers bonded using prior art direct fusion bonding technique.
Figure 1B:
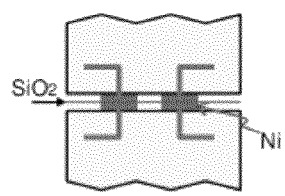
FIG. 1B illustrates vertical cross sectional view of wafers bonded using prior art aligned wafer bonding technique.
Figure 1C:
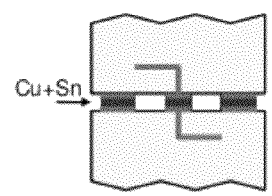
FIG. 1C illustrates vertical cross sectional view of wafers bonded using prior art wafer eutectic bonding technique.

References in the following detailed description of the present invention to "one embodiment", "an embodiment", "another embodiment", or "alternative embodiment" means that a particular feature, structure, or characteristics described in connection with the embodiment is included in at least one embodiment of the invention. The appearances of the phrase "in one embodiment" in various places in this detailed description are not necessarily all referring to the same embodiment.

Also as used herein and in the claims to follow, the words wafer and semiconductor wafer mean a repetitive matrix of circuits and/or electrically responsive devices and/or optically responsive devices (preferably but not necessarily greater than 2 inches in dia), and includes epitaxial layers having circuits, electronically responsive devices and/or optically responsive devices formed in (which includes on, and vice versa) the epitaxial layer on a substrate that may or may not be a semiconductor (a host substrate). The words bond and bonding as used herein and in the claims is used in conjunction with the bonding of wafer bonding surfaces and/or electrical interconnects and/or optical interconnects on the wafers. For wafers comprising circuits, electronically responsive devices and/or optically responsive devices formed in an epitaxial layer on a host substrate that may or may not be a semiconductor, the bonding of the epitaxial layer and/or electrical and/or optical interconnects on the epitaxial layer on a host substrate includes such bonding to another wafer (stacking), which itself may be an epitaxial layer that had been on a host wafer, but has been separated therefrom. To the extent bonding is used in conjunction with electrical interconnects or optical interconnects, bonding means electrically connecting and optically connecting adjacent wafers, respectively, for the transfer of electrical and/or optical signals or information, respectively. Finally, optical usually, but not necessarily refers to visually perceivable light. Also the word signal or signals as used with respect to electrical signals includes electrical power.

Methods for bonding III-V and CMOS semiconductor wafers are described herein. In the following description, for the purpose of explanation, numerous specific details are set forth in order to provide a thorough understanding of the invention. It will be apparent, however, to one skilled in the art that the invention can be practiced with different specific details. In other instances, structures and devices are shown in block diagram or cross sectional diagram form in order to avoid obscuring the invention.

The present invention comprises semiconductor wafer bonding methods that overcome the aforementioned deficiencies of prior art semiconductor wafer bonding methods and also comprises methods for bonding semiconductor wafers whereby multiple III-V material photonic wafers each with patterned layers are sequentially bonded to each other and collectively bonded to a Si based CMOS wafer with the bonding interface between any two adjacent layers (either photonic-photonic or photonic-silicon) incorporating means to transfer both electrical and light signals between the bonded layers.

Preferred Embodiment Wafer Bonding Process Flow

Figure 2:
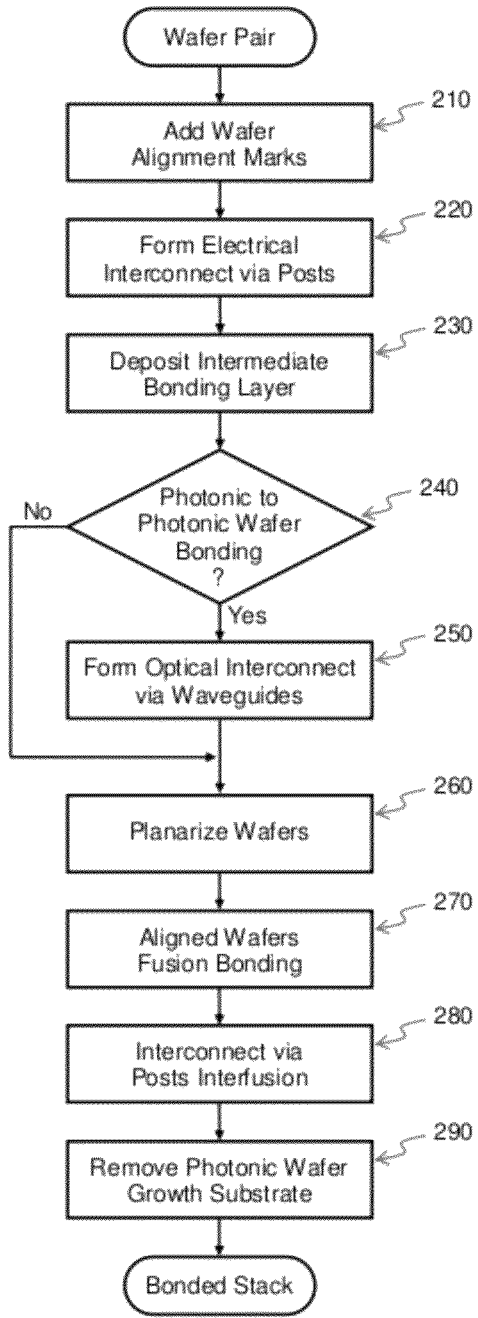
FIG. 2 illustrates the semiconductor processing flow of the wafer bonding methods of the present invention that incorporates the formation of electrical and optical interconnects across the bonded wafers interface.

The semiconductor wafer bonding process flow of the preferred embodiment of the present invention is illustrated in FIG. 2. The semiconductor processing flow illustrated in FIG. 2 shows the wafer bonding processing sequence associated with the bonding of two wafers, either both wafers being photonic wafers or one wafer being photonic wafer and the other being a silicon based CMOS wafer. Furthermore, at least one of the two wafers that can be bonded using the wafer bonding sequence illustrated in FIG. 2 can also be a wafer stack comprising multiple wafers that were previously bonded, either using the wafer bonding procedure illustrated in FIG. 2 or some other wafer bonding method. A person skilled in the art would know that the wafer bonding processing sequence illustrated in FIG. 2 can be sequentially repeated to bond multiple wafers in order to create a stack of multiple bonded wafers, including but not limited to a stack of multiple photonic wafers that are collectively bonded as a stack to a Si based CMOS wafer.

Prior to the start of the wafer bonding sequence illustrated in FIG. 2 that includes the bonding of a CMOS wafer, interconnect tungsten plugs are extended from the control circuits embedded within the CMOS to the top surface of the wafer. These interconnect tungsten plugs constitute the electrical interfaces to the control circuits embedded within the CMOS wafer. The density of the interconnect tungsten plugs of the CMOS must be at least equal to or greater than the sought after resolution of the device photonic elements array (which can be the array of pixels in the case of the device described in U.S. Pat. Nos. 7,623,560, 7,767,479 and 7,829,902 or an array of photonic detectors in the case of a device such as that described in H. Schneider, et al, Dual band QWIP focal plane array for the second and third atmospheric windows, Infrared Physics & Technology, 47 (2005) 53-58). Also prior to the bonding of a photonic wafer, the III-V material based photonic wafers are patterned to delineate the device die boundaries and the device photonic elements array (which can be the array of pixels in the case of the device described in U.S. Pat.

Nos. 7,623,560, 7,767,479 and 7,829,902). The patterning of the photonic wafers would also typically include the deposition of electrically isolated metal contacts for each of the device photonic elements (which can be the individual pixels in the case of the device described in U.S. Pat. Nos. 7,623,560, 7,767,479 and 7,829,902). The formed array of photonic element metal contacts would match the array of interconnect tungsten plugs extended to the top of the CMOS wafer.

The wafer bonding sequence illustrated in FIG. 2 starts (Box-210) by including within the two wafers to be bonded alignment marks having sufficient features definition to enable precise alignment of the two wafers to less that 10% of the diameter of the smallest interconnect vias. In Box-220 of the wafer bonding sequence illustrated in FIG. 2 the wafer to be bonded, either a photonic or CMOS wafer, is processed to create the inter-wafer electrical interconnect via posts. These electrical interconnect via posts will be formed on top of either the interconnect tungsten plugs (contacts), in the case of the CMOS wafer, or on top of the photonic element (pixel) metal contacts, in case of the photonic wafer, using typical semiconductor processing methods such as lithography and metal plating. The electrical interconnect via posts would be formed using metal suitable for low temperature solid-state fusion, such as nickel (Ni), tin (Sn), copper (Cu), gold (Au), germanium (Ge) or indium (In). The diameter of the formed electrical interconnect via posts is dictated by: (1) the required density of the inter-wafer interconnect contacts; (2) the need to include enough volume of metal within the formed electrical interconnect via posts to enable their interfusion across the bonding interface surface under the target temperature of the post-bond annealing step of the flow (Box-280 of FIGS. 2); and (3) the critical need to keep the interconnect posts cross sectional area a small portion (preferably less than 30%) of the wafer bonding interface surface area. Making the interconnect posts cross sectional area be a small portion (preferably less than 30%) of the wafer bonding interface surface area is critical because it does not contribute to the initial fusion bonding of the wafers.

After the electrical interconnect via posts are formed on the bonding surface of each of the two wafers to be bonded, a dielectric intermediary bonding layer is deposited (Box-230 of FIG. 2) on the bonding interface surface of the wafers to be bonded. The dielectric intermediary bonding layer, which should exhibit good adhesion with the wafers to be bonded, is used as the fusion bonding agent and would typically be either silicon oxide ($SiO_2$) or silicon nitride ($Si_2N_3$). Depending on the degree of mismatch in the thermal coefficient of expansion (CTE) across the wafer bonding interface, either $SiO_2$ or $Si_2N_3$ would be selected as a dielectric intermediary bonding layer that can adequately transition the thermal expansion between the two wafers with minimum induced strain on the bonding interface. The dielectric intermediary bonding layer would typically be deposited using plasma enhanced chemical vapor phase deposition (PECVD) type of equipment with the deposited thickness being sufficient to cover the full height of the electrical interconnect via posts formed in the previous step of the bonding sequence (Box-220 of FIG. 2).

The wafer bonding sequence of FIG. 2 splits out (Box-240 of FIG. 2) to differentiate the processing for the case of bonding two photonic wafers that require light as well as electrical interconnect signals to be transferred between the bonded wafers. This type of wafer bonding requirement is included in devices that include the stacking of multiple photonic layers which would be collectively stacked on top of a CMOS wafer such as in the case of the multi-color emissive micro-display device described in U.S. Pat. Nos. 7,623,560, 7,767,479 and 7,829,902 or any comparable optoelectronics device. In this case the wafer bonding sequence includes a step (Box-240) to incorporate means to transfer (route) the light from one photonic layer through the one or more layers stacked on top of it. In effect in this type of wafer bonding one must include an "optical interconnect via" that can be used to efficiently transfer (or guide) the light between the stacked (bonded) photonic layers. In the preferred embodiment of the invention this is accomplished by incorporating optical waveguides within the wafer dielectric intermediary bonding layer to act as optical interconnect vias (Box-250). These vertical waveguides, or optical interconnect vias, are created by incorporating multiple discrete regions within the dielectric intermediary bonding layer comprised of a dielectric material having an index of refraction that is higher than the index of refraction of dielectric intermediary bonding layer. These optical interconnect vias will act to confine and guide the light being transferred across the dielectric intermediary bonding layer based on total internal reflection (TIR) principal, thus allowing light to be efficiently transferred between the bonded wafers.

The optical interconnect vias are incorporated into the dielectric intermediary bonding layer (Box-250) by first etching selected regions of the dielectric intermediary bonding layer corresponding with the required placement of the optical interconnect vias then refilling the etched regions with a dielectric material having an index of refraction that is higher than the index of refraction of the dielectric intermediary bonding layer. For example, when silicon oxide ($SiO_2$) is used as the dielectric material for the dielectric intermediary bonding layer and since $SiO_2$ has a 1.46 refractive index; silicon nitride ($Si_2N_3$), which has a 2.05 refractive index, can be used to form the optical interconnect vias across the dielectric intermediary bonding layer. The etching and refilling of the optical interconnect vias would typically be accomplished using ICP/RIE and PECVD type of equipment; respectively. Similar to the case of the electrical interconnect vias, the formed optical interconnect vias would also be aligned between the bonding wafers. In the preferred embodiment of this invention the optical interconnect vias are interspersed in between the electrical interconnect vias from which a uniform pattern of optical interconnects and electric interconnects across the wafer bonding surface. However, it should be noted that the position, plurality and arrangement pattern of the optical interconnect vias formed across the bonding interface surface would typically be commensurate with the specific positions within the optoelectronics device die, and therefore the bonded wafers, where the electrical and optical signals need to be transferred across the multiple layers of the optoelectronics device die formed by the 3D-IC wafer stack. At the end of this step (Box-250 of FIG. 2) of the wafer bonding sequence the wafers bonding surface would be comprised of the dielectric intermediary bonding layer embedded within which are an interspersed array of electrical and optical interconnect vias that are substantially aligned to the same pattern across the bonding surfaces of the two wafers and also substantially aligned relative to the alignment marks incorporated within the two wafers to be bonded.

In either the case when the processed wafer includes both optical and electrical interconnect vias or electrical interconnect vias only, the wafers would be planarized using chemical mechanical polishing (CMP) to a root mean square (RMS) roughness of less than 0.5 nanometer across the wafer bonding surface (Box-260 of FIG. 2). The achieved surface roughness of the wafers' bonding surfaces after the CMP planarization step (Box-260) should be uniform within the Van der Waals atomic radius across the wafer bonding surface. This bonding surface planarization requirement is critical for the attainment of uniform interfusion of the dielectric intermediary bonding layer across the wafers' bonding surfaces when these surfaces are brought into contact with each other. This is also of particular importance since the wafer bonding surface is comprised of the heterogeneous regions of materials; namely, the dielectric intermediate bonding layer, and the electrical and optical interconnect vias materials. Consequently the CMP selectivity would have to be carefully controlled to avoid excessive under or over polishing of any of these bonding surface regions. In particular in order to achieve uniform interfusion bonding across the wafer surface it is important to maintain the cross sectional surface of the electrical interconnect vias to not be above, and preferably to be slightly below the planarized (polished) surface of the dielectric intermediary bonding layer. This is important because the initial low temperature interfusion of the wafer bonding surfaces would occur across the dielectric intermediary bonding layer of the wafer bonding surfaces and an excessive electrical interconnect vias height would prevent such an interfusion, thus creating a bubble void of interfused dielectric intermediary bonding layer around it.

An important step after the planarization of the wafers to be bonded is the thorough cleaning of the bonding surface of the wafers to be bonded. This post-CMP cleaning should at least include thorough scrubbing of the polished wafer surface to remove any and all possible debris created by the planarization process off the bonding surface of the wafer. The post-CMP cleaning can be performed using typical semiconductor wafer cleaning equipment such as Aux 1700 or the like. Following the post-CMP scrubbing of the wafer bonding surface, the wafer would have to be thoroughly cleaned with a rigorous semiconductor wafer cleaning process such as RCA cleaning solution consisting of de-ionized water, hydrogen peroxide, ammonium hydroxide ($H_2O:H_2O_2:NH_4OH$) with the ratios adjusted to match the formed heterogeneous material bonding surface of the wafers. The wafer is then dipped in a highly diluted hydrofluoric acid (HF) aqueous solution with the dilution ratio adjusted to match the formed heterogeneous material bonding surface of the wafers then cleaned again with RCA cleaning solution. Following the wafer bonding surface cleaning, the bonding surface of both wafers would have to be thoroughly de-oxidized and activated. This wafer bonding surface activation would typically be performed by subjecting the wafer bonding surface to oxygen (O), nitrogen (N) and/or argon (Ar) plasma treatment in a reactive ion etching (RIE) mode with the type of plasma being selected to achieve uniform activation across the formed heterogeneous material surface of the wafers. This plasma treatment of the wafer bonding surface would be performed using typical semiconductor RIE equipment such as Oxford Instrument Plasma Lab or Asher or the like.

Within a short time interval after the wafer bonding surfaces are activated, the two wafers would be mutually aligned relative to one another and their bonding surfaces brought into contact in order to initiate initial fusion bonding across the wafer bonding interface surface (Box-270 of FIG. 2). Typically in this step of the bonding sequence the wafers are placed in an alignment fixture that is used to maintain the achieved wafer alignment throughout the wafer bonding and subsequent steps. Preferably the wafers would be brought into alignment and surface contact in vacuum. It may also be preferable to apply slight level of pressure on the opposite side of the two wafers immediately after the two wafer surfaces are brought into contact. The wafer alignment, contact and fusion bonding initiation step (Box-270 of FIG. 2) is typically performed by semiconductor equipment that is capable of aligning the two wafers to within less than 10% of the smaller interconnect via diameter, which can be less than 100 nanometer, especially in the case of devices such as those described in U.S. Pat. Nos. 7,623,560, 7,767,479 and 7,829,902. The types of semiconductor equipment that are typically used for mask and wafer alignment such as the Suss MicroTec or EVG Mask Aligner or the like are capable of achieving such a level of wafer-to-wafer alignment.

Fusion bonding of the dielectric intermediary bonding layer materials across the two wafers bonding surface would typically start immediately once the two wafers bonding surface are brought into contact. However, it is typically necessary to further induce the fusion bonding process by annealing the bonded wafer pair in elevated temperature ramping from room temperature that can reach over 100° C. for multiple hours preferably while the two wafers are still held in aligned contact (Box-270 of FIG. 2). This post-bonding annealing would typically be performed while the wafers are still placed in the alignment fixture in which the two wafers were originally aligned and brought into contact during the wafer alignment and contact step (Box-270 FIG. 2). Of particular importance to this step is the degree of mismatch between the thermal coefficients of expansion (CTE) of the two wafers. As such the profile of the post-bonding annealing performed in this step (Box-270 FIG. 2) in terms of duration and the highest temperature reached must take into account the difference in the expansion of the two bonded wafers and wafer size. For a large CTE difference between the two bonded wafers it may be necessary to use longer duration annealing at a low temperature rather than annealing at high temperature for a shorter duration. The primary reason for such an approach is to maintain the attained accurate alignment of the bonded wafers. In order to further promote the attained fusion bonding across the wafer bonding interface it may also be necessary to maintain a certain level of pressure on the opposite sides of the bonded wafer pair.

Depending on the surface roughness achieved across the bonding interface surface, at the end of the fusion bonding step (Box-270 FIG. 2) the dielectric intermediary bonding layers as well as the cross section of the optical interconnect via posts on the opposing surfaces of the wafers would be interfused together across the bonding interface surface of the two wafers. However, the wafer polishing and surface activation processes could cause the electrical interconnect vias interface surface to be recessed below the dielectric surface which would result in the presence of a gap between the opposing surfaces of the electrical vias across the wafer bonding interface surface. The presence of such gaps between the electrical interconnect via posts could cause an excessive level of electrical resistance between the corresponding electrical circuits of the bonding wafers. In order to minimize the electrical resistance across the interconnect vias, the bonded wafers are subjected to further annealing at elevated temperature to cause the electrical via posts to thermally expand and interfuse across the bonding interface (Box-280 FIG. 2). During this step (Box-280 FIG. 2) appropriate levels of elevated temperature, and possibly also pressure, would typically be needed to: (1) further promote the fusion bonding achieved during the previous step (Box-270 FIGS. 2); and (2) to primarily cause the interfusion of the electrical interconnect via posts across the bonding surface of the two wafers. In order to achieve the latter of these two objectives, in this step (Box-280 FIG. 2) the temperature of the bonded wafer pair would have to be elevated such that the thermal expansion of the electrical interconnect via posts will cause the electrical interconnect via posts of the opposing wafers to come into contact and interfuse across the wafers bonding interface surface. Depending on the type of metallic material used in forming the electrical interconnect via posts, the elevated temperature can reach over 250° C. for multiple hours preferably while the two wafers are still held in aligned contact. In the interconnect via posts interfusion step (Box-280 FIG. 2) the metallic material comprising the electrical interconnect via posts at the opposing sides of the bonding interface will interfuse due to the thermal compression formed under elevated temperature annealing due to the combination of the increased dielectric intermediary bonding layer fusion bonding strength and the thermal expansion of the metallic material. The electrical interconnect via posts would bond across the wafer bonding interface due to metal-to-metal thermal compression interfusion (or solid-state diffusion bonding) formed in part by the strength of the fusion bonding of the dielectric intermediary bonding layer achieved during the fusion bonding step (Box-270 FIG. 2). Therefore, the strength of the achieved fusion bonding across the wafers bonding surface during the fusion bonding step (Box-270 FIG. 2) is of critical importance since it plays a crucial part in attaining the adequate level of thermal compression needed to cause the electrical interconnect via posts to interdiffuse across the bonding surface of the two wafers. During the interconnect via posts interfusion step (Box-280 FIG. 2), the combined strength of the achieved fusion bonding plus any applied pressure across the wafer bonding surfaces must be sufficient to cause a compression reaching at least a fraction of the yield stress point of the metallic material of the electrical interconnect vias posts. At a sufficient compression across the wafers bonding surface, the electrical interconnect via posts could interfuse across the bonding interface surface of the two wafers typically at a temperature around 0.2-0.3 of the melting point of the metallic material of the electrical interconnect via posts.

The preferred embodiment of this invention also includes a method that can be included in the interconnect via posts interfusion step (Box-280 FIG. 2) whereby an electrical current is driven through a partially interfused electrical interconnect vias after interfusion annealing of the bonded wafers at a lower temperature. In this method the high electrical resistance of the partially interfused electrical interconnect vias is leveraged to cause an increase in the temperature that causes the interconnect vias to become fully interfused to allow an electrical current to be applied through the electrical interconnect vias after the wafers are bonded. This method is particularly of value in cases in which it is preferred to perform the interconnect via posts interfusion annealing at lower temperature. As discussed earlier, it is critical to use lower temperature during the post bonding annealing in order to alleviate the adverse effects of any possible mismatch in the coefficients of thermal expansion (CTE) of the bonded wafers.

After the completion of the interconnect via posts interfusion annealing step (Box-280 FIG. 2) of the wafer bonding flow of FIG. 2, the epitaxial growth substrate of the bonded photonic wafer is removed in preparation for the further processing needed to create the electrical contact on the opposite side of the photonic elements to bond another photonic wafer on that side of the bonded wafer pair (Box-290 of FIG. 2). Depending on its material system, the epitaxial growth substrate of a typical photonic wafer is either gallium nitride (GaN), gallium arsenide (GaAs), indium phosphide (InP), silicon carbide (SiC) or silicon (Si). The removal of the epitaxial growth substrate of the photonic wafer would typical be performed using either laser lift-off, epitaxial lift-off or CMP lift-off. In the laser lift-off (LLO) case, a UV laser beam is scanned across the wafer to cause an increase in the temperature of a sacrificial buffer layer placed between the epitaxial growth substrate and the epitaxial photonic layers. This increase in the buffer layer temperature would cause the buffer layer to split into its constituent chemical elements thus causing the substrate to separate from the bonded wafer pair. The epitaxial lift-off (ELO) process is similar to the LLO process except that chemical treatment is used to dissolve the sacrificial buffer layer. In the CMP lift-off process the epitaxial growth substrate is removed by first grinding the growth substrate using coarse slurry to a thickness of only few microns then using finer slurry to totally remove it. Each of these three lift-off methods is best suited for the lift-off of a particular type of growth substrate; for example LLO is best suited for removing sapphire growth substrate with the buffer layer being GaN and either ELO or CMP lift-off are best suited for the removal of GaAs growth substrate.

Figure 1D:
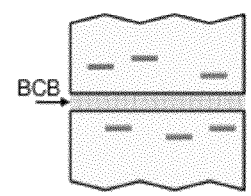
FIG. 1D illustrates vertical cross sectional view of wafers bonded using prior art wafer adhesive bonding technique.

After the completion of the wafer bonding sequence illustrated in FIG. 2, the bonded wafers would be processed to articulate the photonic elements on the side from which the epitaxial growth substrate was removed and the wafer stack is ready for bonding with another photonic wafer using the same wafer bonding flow illustrated in FIG. 2. This wafer bonding flow can be repeated sequentially to create a stack of multiple thin photonic layers through which both electrical as well as light signals can propagate. Such a multiple photonic layer stack can be formed either directly on top of the CMOS wafer that incorporates the circuits that control the elements of the thin photonic layers, in which case the CMOS will act as the host wafer upon which the photonic layers will be bonded sequentially using the wafer bonding sequence illustrated in FIG. 2. In this case in order to encapsulate the bonded stack while allowing light to reach the top surface of the stack, a transparent cover glass wafer would be bonded to the top surface of the stack using direct fusion bonding (see FIG. 1A) or adhesive BCB bonding (see FIG. 1D).

Alternatively the wafer bonding sequence illustrated in FIG. 2 can be sequentially repeated to form the photonic layer stack on top of a transparent glass wafer and the formed photonic wafer stack can subsequently be bonded to the control CMOS wafer also using the wafer bonding sequence illustrated in FIG. 2. In this case the transparent glass wafer would serve two purposes: (1) act as the host wafer upon which the photonic wafer stack is formed; and (2) act as means to encapsulate the bonded photonic stack while allowing light to reach the top surface of the stack. Since the bonding with the glass cover wafer does not require the inclusion of any interconnects, either direct fusion bonding (FIG. 1A) or adhesive BCB bonding (FIG. 1D) methods can be used in the bonding step (Box-270 of FIG. 2) of the wafer bonding sequence illustrated in FIG. 2 to bond the first photonic wafer after it is patterned to incorporate the photonic element (pixel array). After the first photonic wafer is bonded to the glass cover wafer, the epitaxial growth substrate would be lifted off the back side of the photonic wafer using the substrate removal step (Box-290 of FIG. 2) of the wafer bonding sequence illustrated in FIG. 2. The primary advantage of the alternative method of using the wafer bonding sequence illustrated in FIG. 2 is that it avoids subjecting the CMOS wafer to the multiple anneal steps associated with the bonding of each photonic wafer. In this case the CMOS wafer is subjected only to one post bonding anneal step (Box-280 of FIG. 2) to interfuse the electrical interconnect via posts at the end of the wafer stacking sequences. This could be a preferred method of using the wafer bonding sequence illustrated in FIG. 2 in order to avoid any possible damage to the CMOS wafer that could occur due to multiple elevated temperature annealing.

The preceding description of the wafer bonding sequence of the preferred embodiment includes the description of multiple semiconductor processing steps arranged in a specific order. However a person skilled in the art would know that some of the described steps can be performed in a different order without deviating from the intended objective of the preferred embodiment of bonding semiconductor wafers that incorporate both electrical and optical interconnect vias across the wafer bonding interface. A person skilled in the art would also know that although the wafer bonding sequence of the preceding discussion describes the bonding of photonic and CMOS wafers, the described wafer bonding method is equally applicable for bonding CMOS to CMOS wafer whereby both electrical and light signals need to be transferred across the bonding surface of the wafers.

Bonded Multi Layers Stack Incorporating Electrical and Optical Interconnect

Figure 3A:
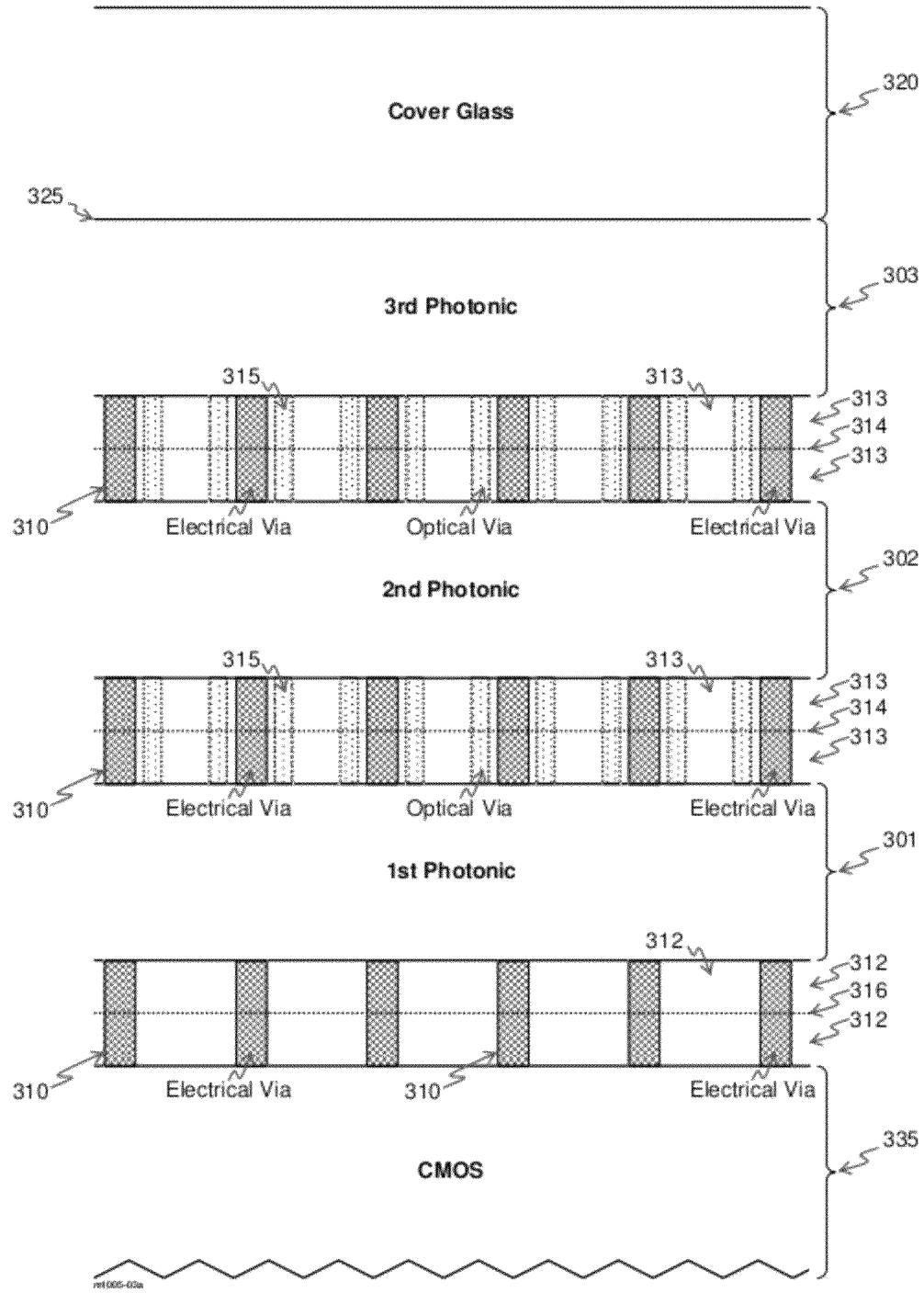
FIG. 3A illustrates a vertical cross sectional view of multiple wafers bonded using wafer bonding methods of this invention to incorporate electrical and optical interconnects across the bonded wafers interface.
Figure 3B:
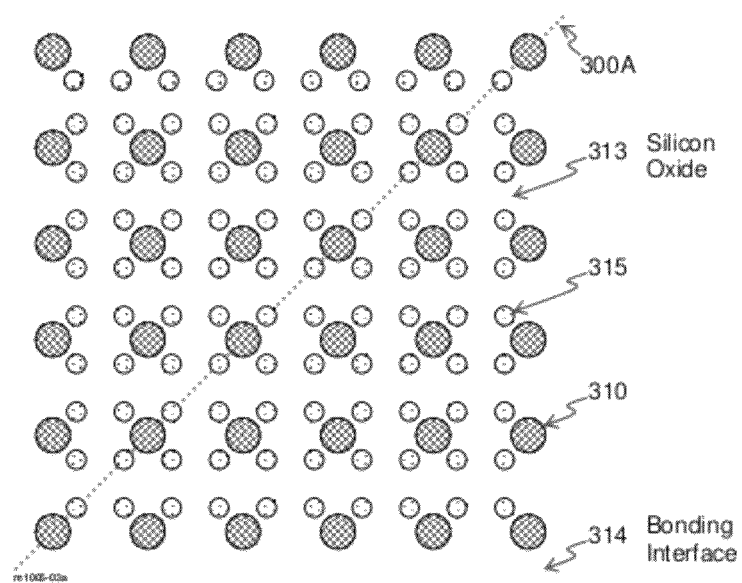
FIG. 3B illustrates a horizontal cross sectional view of the bonding interface surface between bonded wafers illustrating the wafer bonding surface that incorporates electrical and optical interconnects formed using the wafer bonding methods of this invention.

FIG. 3A and FIG. 3B illustrates the cross sectional view of a multiple layer stack bonded using the preferred embodiment wafer bonded method described in FIG. 2. FIG. 3A illustrates a cross sectional view of a multi layer stack comprised of three photonic layers 301, 302 and 303 which are bonded onto one another and bonded to a CMOS layer 335 using the preferred embodiment wafer bonded method described in FIG. 2. The bonded multi layer stack illustrated in FIG. 3A incorporates both electrical interconnect vias 310 and optical interconnect vias 315 embedded within the dielectric intermediary bonding layers 313, with dielectric intermediary bonding layers 312 incorporating only electrical the interconnects 310, all formed by sequentially using the wafer bonding flow illustrated in FIG. 2 and described in the preceding discussion. As illustrated in FIG. 3A the bonding interface 314 between the photonic layer pairs (301,302) and (302,303) incorporates both the electrical interconnect vias 310 as well as the optical interconnect vias 315 while the bonding interface 316 incorporates only the electrical interconnect vias 310. The electrical interconnect vias 310 are formed (using step 220 of the wafer bonding flow of FIG. 2) on the bonding side of each wafer and would be composed of a single metal layer such as nickel (Sn), tin (Sn), copper (Cu) or the like material suitable for bonding using thermal compression induced solid-state diffusion bonding (using step 280 of the wafer bonding flow of FIG. 2). Also described earlier, if the wafer bonding dielectric intermediary bonding layer 313 is $SiO_2$, then in order to create the needed refractive index difference needed to enable the optical confinement aspect of the optical interconnect vias 315, the optical interconnect vias 315 would be $Si_2N_3$.

It is important to point out the importance of the relative alignment of the optical interconnect vias 315 between photonic layers 301, 302 and 303. Such an alignment of the optical interconnect vias 315 is important because it allows light to be transferred not only between two adjacent photonic layers (for example 301 and 302 or 302 and 303) but also between two non-adjacent photonic layers (for example 301 and 303). This is particularly useful when the optical interconnect vias 315 are also aligned with light extraction means (such as the vertical waveguides described in U.S. Pat. Nos. 7,623,560, 7,767,479 and 7,829,902) included within each of the photonic layers 301, 302 and 303. In the preferred embodiment of this invention the relative alignment of the optical interconnect vias 315 as well as their alignment with the light extraction means (such as the vertical waveguides of the multi-color emissive micro-display device described in U.S. Pat. Nos. 7,623,560, 7,767,479 and 7,829,902) incorporated within the stacked photonic layers is used to extract the light generated within each of the photonic layers 301, 302 and 303 through other photonic layers as well as through the wafer dielectric intermediary bonding layers 313 to the surface of the emissive device. In a similar way the relative alignment of the optical interconnect vias 315 and a possible light guiding means embedded within the photonic layers 301, 302 and 303 can be used to guide light incident of the surface of the device to its interior to reach any of the stacked photonic layers 301, 310 and 303.

FIG. 3A also illustrates the dielectric intermediary bonding layer between the CMOS layer and the photonic layer stack whereby the wafer bonding interface 316 incorporates only electrical interconnect vias which is also formed using the wafer bonding procedure described in FIG. 2. As illustrated in FIG. 3A the dielectric intermediary bonding layer in this case incorporates the electrical interconnects vias needed for all of the multiple photonic layers stacked on top of the CMOS layer. The dielectric intermediary bonding layer 312 of FIG. 3A in this case can either be $SiO_2$ or $Si_2N_3$ depending upon the degree of mismatch in the thermal expansion of the photonic wafer and the CMOS wafer.

FIG. 3B illustrates a horizontal cross sectional view of the wafer bonding interface 314 showing the interspersing of the electrical 310 and optical 315 interconnect vias across the surface of the wafer bonding interface 314. FIG. 3B also shows the interspersed electrical 310 and optical 315 interconnect vias being both embedded within the wafer dielectric intermediary bonding layer 313. It is important to emphasize that the density of photonic elements patterned on the photonic wafers affects the overall density of interconnect vias across the wafer bonding interface 314. For example if the photonic elements (pixel) array pitch of the device incorporated on the wafers bonded using the wafer bonding process illustrated in FIG. 2 is 10 micron and the three stacked photonic layers 301, 302 and 303 require a common ground contact plus one contact for each of the three layers, then the electrical interconnect vias 310 will have to be spaced 5 micron in both x and y directions. In order to maintain adequate area of dielectric intermediary bonding layer across the bonding interface 314, the diameter of each of the electrical interconnect vias 310 should be maintained at or below 2 micron; which leaves approximately 87% of the bonding interface surface 314 dedicated to the dielectric intermediary bonding layers 312 or 313 of the opposing wafers. In general, it is preferred that the aggregate cross sectional area of the electrical interconnects be less than 30% of the wafer bonding interface surface.

FIG. 3B also shows the dielectric intermediary bonding layer 313 incorporating an array of optical interconnect vias 315 interspersed in between the array of electrical interconnect vias 310. In a wafer bonding example in which the diameter and spacing of the electrical interconnect vias 310 is approximately 2 micron and 5 micron; respectively, FIG. 3B illustrates an array of approximately one micron diameter optical interconnect vias 315 interspersed at 2.5 micron spacing in between the electrical interconnect vias 310 array. As shown in this design example, the smaller of the two types of interconnect vias are the optical interconnect vias, which have a diameter of approximately one micron. Based on the design criteria stated earlier, the bonded wafers would have to be aligned to within 10% of the diameter of the optical interconnect via (being the smaller of the two types of vias), meaning the alignment marks (fiducials) placed on the wafers to be bonded must enable the alignment of the wafers during bonding flow illustrated in FIG. 1 that is less than 100 nanometer in accuracy. It is worth mentioning that most of the wafer bonding equipment currently available in the market; such as the Suss MicroTec or EV Group wafer and mask aligners, can align wafers to less than 50 nanometer accuracy. It is also worth noting that as illustrated in FIG. 3B the wafer dielectric intermediary bonding layer 313 is comprised of two types of dielectric materials; namely, $SiO_2$ and $Si_3N_4$, whereby the $SiO_2$ severs as a bonding agent as well as an optical cladding material for the $Si_3N_4$ optical interconnect vias 315. Similarly, $Si_3N_4$ material from which the optical interconnect vias 315 are formed also serves a dual purpose; the first being as a means to provide the higher refractive index needed to enable the optical waveguide aspects of the optical interconnect vias 315 and the second being to also serve as a part of bonding agent across the wafer bonding interface 314.

It should be stated that the design example cited above is meant for illustration purpose and that a person skilled in the art can tailor the placement of the electrical and optical interconnects 310 and 315 to match the specific requirements of the wafers being bonded without substantially deviating from the wafer bonding process defined in FIG. 2.

Means for Dealing with Wafers' Differential CTE Mismatch

The bonding of multiple photonic wafers based of different material systems (such as III-V GaN and/or GaAs; for example) and the bonding of such wafers or wafer stack onto a silicon based CMOS wafer with the capability to transfer both electrical signals and light output across multiple wafer bonding interfaces includes several additional important aspects. The first is the difference in the coefficient of thermal expansion (CTE) of the materials involved and the second is the bowing of the photonic wafers prior to bonding. The difference in the bonded wafer materials CTE limits the post bonding annealing process as the temperature range that the bonded wafers can withstand becomes limited. As stated earlier elevated temperature annealing is typically relied upon after wafer bonding to strengthen the initial bond formed and to interfuse the electrical interconnects across the bonding surface of the wafers.

Typical CTE values for some relevant wafer materials ($\times 10^{-6}$/K at 25° C.) are 2.6 for silicon (Si), 0.5 for silicon oxide ($SiO_2$), 3.2 for silicon nitride ($Si_3N_4$), 5.73 for gallium arsenide (GaAs), 3.17 for gallium nitride (GaN) and 4.5 for sapphire ($Al_2O_3$). As can be seen for these typical CTE values of different semiconductor materials, both III-V materials such GaN and GaAs would exhibit higher thermal expansion as compared to silicon. More important is the difference in CTE of the III-V material epitaxial growth substrates such as GaAs or sapphire and the silicon based CMOS wafers. $SiO_2$ is typically used as a dielectric intermediary bonding layer between silicon wafers for the fusion bonding methods described in U.S. Pat. Nos. 7,622,324, 7,553,744, 7,485,968 and 7,387,944. However, its low coefficient of thermal expansion could be a disadvantage when bonding III-V GaAs or GaN wafers together or to Si wafer. As seen from data above, silicon nitride has a coefficient of expansion close to that of GaN and between Si and GaAs. Therefore in the preferred embodiment of this invention silicon nitride is preferred as the dielectric intermediary bonding layer for bonding of III-V materials based wafers, such as GaAs and GaN, as well as the bonding of Si and III-V material based wafers rather than $SiO_2$. In general, it is preferred that the CTE of the dielectric intermediary bonding layer have a transition value between the CTE of the two bonded wafers.

The differential CTE mismatch of III-V based photonic wafers and Si based CMOS wafers necessitates a process sequence whereby a majority of device structures are patterned on the photonic wafers prior to wafer bonding with few interconnect and back end of line (BEOL) steps remaining to finish the device. Thus as described earlier, in the preferred embodiment of the wafer bonding of this invention the photonic wafers are patterned prior to wafer bonding. In addition, the inability of the wafer bonding interface layer to withstand the stress generated (due to the differential CTE mismatch of the bonded wafers) during required elevated temperature post-bonding anneal process requires alternative means for annealing the wafer bonding interface after the bonding step. This is particularly the case when a lower annealing does not even achieve sufficient partial interfusion between interconnect via posts to the extent that allows the electrical drive interfusion method describe earlier to be used.

In the preferred embodiment the semiconductor wafer bonding method described herein and illustrated in FIG. 2, laser liftoff (LLO) is one of the methods used to remove photonic growth substrate wafers after bonding (Box-290 of FIG. 2). In this type of substrate lift-off, the substrate side of the bonded wafer stack is illuminated with a raster scanned UV laser beam focused on a sacrificial buffer layer deposited during the epitaxial growth process of the photonic wafer between the growth substrate and the photonic epitaxial device layers deposited on top of the growth substrate. The energy of the scanned UV laser beam would typically be adjusted to generate temperature near the buffer layer that can be in the range from few 100° C. to 800° C. localized over a small area (for example less than 1 $mm^2$) as the UV laser beam is scanned over the wafer for a very short dwell interval (a few milliseconds) depending on the raster scan rate of the beam. For a typical lift-off of the photonic wafer growth substrate, the scanned laser beam energy is used to split the growth buffer layer (which in the case of photonic wafers fabricated using a class of III-V materials known as III-Nitrides is typically GaN) into its constituent elements, thus releasing the device structure epitaxial layers from the growth substrate (which is typically sapphire).

In the preferred embodiment of this invention the localized and rapid temperature rise achieved by the scanned UV laser beam is leveraged for the following multiple purposes: (1) releasing the growth substrate from the bonded wafers, as described earlier; (2) strengthening the fusion bonding across the dielectric intermediary bonding layer; and (3) interfusing the electrical interconnect vias across the bonding interface of the wafers. In addition to achieving the aforementioned multiple critical wafer bonding related functions, such a localized rapid thermal scanning of the bonded wafers using scanned UV laser beam is advantageous in many ways. Most importantly it alleviates the need for the two post-bonding long duration annealing steps needed to strengthen the fusion bonding across the bonded wafers and to interfuse the electrical interconnect vias posts across the bonding interface. As explained earlier, because of the large CTE mismatch of III-V based photonic wafers and the Si based CMOS wafers, such a long duration elevated temperature annealing causes the wafers to become severely misaligned relative to one another and to possibly de-bond due to stress caused by the mismatched thermal expansion. In comparison using the raster scanned UV laser method described earlier to achieve localized rapid thermal scanning prevents the temperature from rising simultaneously over the entire or even a large area of the wafer, thus substantially reducing the magnitude of the thermal expansion of the bonded wafers and subsequently also substantially reducing the stress on the wafer bonding interface. Therefore the localized rapid thermal scanning using UV laser also alleviates the detrimental effects of the post-bonding long duration elevated temperature annealing.

The localized rapid thermal scanning using UV laser of this invention can be realized using typical UV laser used in semiconductor fabrication such JPSA IX-260 machine, for example, which incorporates programmable excimer 248 nm UV laser system. In such a semiconductor laser equipment the laser beam spot shape, size and power as well as the scan pattern can be controlled to achieve the required the conditions of localized and rapid scanning of the preferred embodiment of this invention.

It should be noted that the benefits of the localized rapid thermal scanning using the UV laser of the preferred embodiment of this invention can be realized even in the case when the wafer bonding does involve lift-off of a growth substrate such as: (1) in the case when the bonded III-V photonic wafer growth substrate can be lifted off using either epitaxial or CMP lift-off methods; or (2) in the case when the two bonded wafers are both Si based. In both of these two case the localized rapid thermal scanning using UV laser of the preferred embodiment of this invention can be used for: (1) strengthening the fusion bonding across the dielectric intermediary bonding layer; and (2) interfusing the electrical interconnect vias posts across the bonding interface of the wafers. In both of these two cases the localized rapid thermal scanning using UV laser of the preferred embodiment of this invention also alleviates the detrimental effects of the post-bonding long duration elevated temperature annealing fundamental to prior art wafer bonding.

Figure 3C:
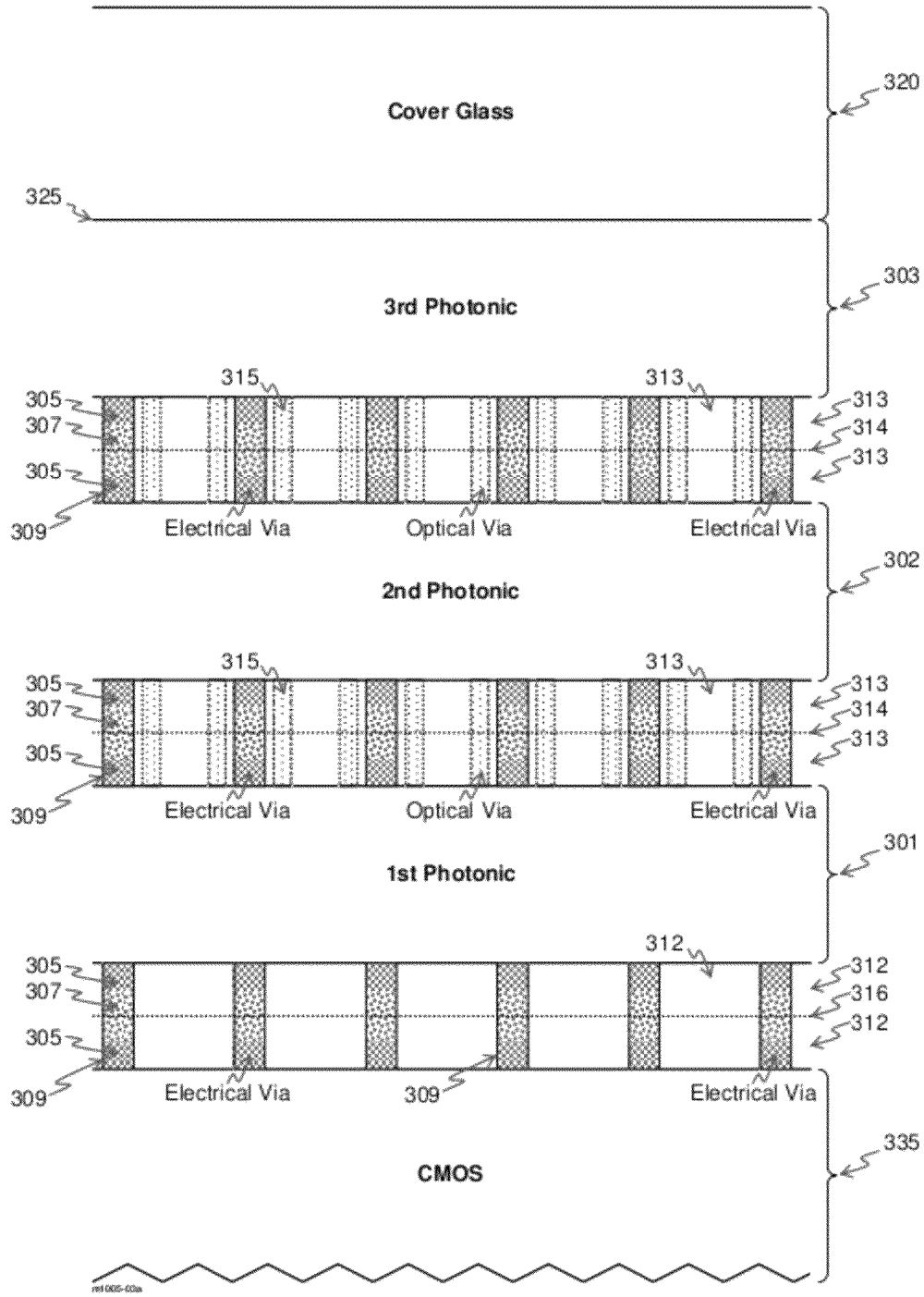
FIG. 3C illustrates a vertical cross sectional view of multiple wafers bonded using alternative wafer bonding methods of this invention to incorporate electrical and optical interconnects across the wafers bonding interface.

FIG. 3C illustrates another variation of the preferred embodiment of the invention in which the electrical interconnect via posts 309 are formed using multiple (at least two) metal layers 305 and 307 whereby the materials used in the said multiple metal layers are suitable for low temperature isothermal solidification bonding, including Ni, Sn, In, Cu, Au or Ag and other related materials. The use of the multiple metal layers electrical interconnect via posts 309 illustrated in FIG. 3C enables the use of lower annealing temperature to interfuse the electrical interconnect via posts in step 280 of FIG. 2, which in turn reduces the adverse effects of the wafers' differential CTE mismatch. Depending of the choice of the metal layers 305 and 307, the annealing temperature required to interfuse the multiple metal layers electrical interconnect via posts 309 can be accomplished possibly below 200° C., which is substantially lower than the annealing temperature required for interfusion of a single metal interconnect via posts which can reach in excess of 400° C. Other benefits will become more apparent after the following detailed discussion.

Referring to FIG. 3C, the electrical interconnect via posts 309 are illustrated to be comprised of two layers 305 and 307, e.g. In/Sn, Ni/Sn, Cu/Sn or Au/Sn, whereby the metal layers at the bonding interface surface are chosen such that at the interfusion temperature; i.e., the annealing temperature used in step 280 of FIG. 2, the formation of intermetallic compounds of the two metal layers 305 and 307 would lead to the creation of an interfused solid-state bond across the bonding interface. In this two layer electrical interconnect via posts approach illustrated in FIG. 3C, the metallic layer 307 of the electrical interconnect via posts 309 facing the bonding interface surfaces 314 and 316 would be selected to have the lower melting point of the two layers 305 and 307 and the interfusion temperature would be selected to be near the melting point of the metallic layer 307. At the interfusion temperature, the metallic layer 307 would reach a transient liquid-phase and the interfusion of the two metallic layers 305 and 307 would cause solidification of the resultant intermetallic compound. This technique is sometimes referred to as transient liquid-phase bonding and is also known as isothermal solidification bonding and is typically used in bonding that requires low interfusion temperature (see M. Alexe and U. Güsele, Wafer Bonding Applications and Technology, pp 327-415, Springer 2004).

When the metals of the two layers 305 and 307 are appropriately selected, the re-melt temperature of the formed intermetallic compound of the interfused layers 305 and 307 would be higher than their interfusion temperature and could possibly be made to be even higher than the melting temperature of both of the metal layers 305 and 307, depending on the choice of the seed and/or contact metal layer used in the formation of the electrical interconnect via posts 309. For example, when the metal layers 305 and 307 are selected to be tin (Sn) and indium (In); respectively, the choice of a copper (Cu) as a seed or contact layer would lead to an interfusion temperature of 160° C. and a re-melt temperature in excess of 470° C. (see M. M. Hou, et al, Low Temperature Transient Liquid Phase (LTTLP) Bonding for Au/Cu and Cu/Cu Interconnections, Journal of Electronic Packaging, Vol. 114, 443-447, (1994)). In another example, when the metal layers 305 and 307 are selected to be nickel (Ni) and tin (Sn); respectively, the choice of aluminum (Al) as a seed or contact layer would lead to an interfusion temperature close to 230° C. and a re-melt temperature in excess of 800° C. Besides the lower interfusion temperature it enables, the higher re-melt temperature of the multiple metal layers electrical interconnect via posts illustrated in FIG. 3 is also beneficial for the bonding of the multiple layers stack illustrated in FIG. 3C. In that regard the higher re-melt temperature would allow the electrical interconnect via posts 309 interfused at low temperature to reliably withstand the multiple annealing associated with sequential bonding of the multiple layer stack illustrated in FIG. 3C.

Besides enabling lower interfusion temperature for the electrical interconnect via posts, the use of the multiple metal layers electrical interconnect via posts 309 would allow their interfusion to occur at a substantially smaller total volumetric size for the electrical via posts 309 primarily due to the transient liquid phase aspects of the two metal layers electrical via posts 309 interfusion combined with the thermal compression effect due to the combination of the annealing and the bonding strength of the interfused dielectric intermediary bonding layers 312 and 313. This would enable the use of electric interconnect via posts 309 having the substantially reduced diameter and height of less than 1 micron for each dimension. Furthermore, the occurrence of the interfusion of the two metal layers electrical via posts 309 in a transient liquid phase makes the recessed top surface of the electrical via posts 309 after the CMP step 260 of FIG. 2 of no critical consequences to the electrical interconnects via posts interfusion step 280 of FIG. 2.

The reduced diameter of the electrical interconnect via posts 309 would enable the formation of the ultra high interconnect density needed to realize 3D-IC optoelectronic devices with optical element (pixel) density greater than $4 \times 10^6$ interconnects per $cm^2$ or higher. Alternatively the reduced diameter of the electrical interconnect via posts 309 could enable the formation of a wafer dielectric intermediary bonding layer that would cover greater than 90% of the wafer bonding interface surface 314 and 316, which would be beneficial in substantially increasing the strength of the achieved bonding of the dielectric intermediary bonding layers 312 and 313 across the wafer bonding interfaces 314 and 316. The reduced height of the electrical interconnect via posts 309 would substantially reduce the required thickness of the dielectric intermediary bonding layers 313, which would lead to a substantial reduction in the optical losses of the reduced height optical interconnects 315. Furthermore, the reduced volumetric size of the electrical interconnect via posts 309 would contribute to reducing the electrical resistance between the multiple layers stack illustrated in FIG. 3C.

The low temperature interconnect via posts interfusion of the preferred embodiment of this invention would be used to interfuse the multiple layer interconnect via posts 309 illustrated in FIG. 3C and would be performed within the same flow of the wafer bonding process of FIG. 2, specifically the interconnect via posts interfusion step 280 of FIG. 2, using either standard semiconductor furnace anneal, rapid thermal anneal, the localized rapid thermal scanning using UV laser method described earlier and/or the current drive annealing method described earlier. The multiple metal layers electrical interconnect via posts 309 can be formed using semiconductor electroplating techniques or other metal deposition techniques such as e-beam or sputter evaporators.

Therefore the benefits of the multiple metal layers electrical interconnect via posts illustrated in FIG. 3C are multifold: (1) lowering the annealing temperature required for the interfusion of the electrical interconnect via posts across the wafer bonding interface surface, thus alleviating the adverse effects of the CTE mismatch between the bonded wafers; (2) reducing the via posts volumetric size needed to achieve their interfusion across the wafer bonding interface surface, thus enabling the reduction of the thickness of the wafer dielectric intermediary bonding layer and consequently the height of the optical interconnects as well, which would result in a reduction in the optical losses across the wafer dielectric intermediary bonding layer and an increase in the optical interconnect efficiency across the bonded wafers; (3) reducing electrical resistance across the electrical interconnect via posts, thus increasing the electrical interconnect efficiency across the bonded wafers; (4) increasing the attainable density of the interconnect via across the wafer bonding interface surface, thus allowing the realization of ultra high density photonic array devices (of the type described in U.S. Pat. Nos. 7,623,560, 7,767,479 and 7,829,902, for example]; and (5) reducing the cross sectional area of the interconnect via posts across the wafer bonding interface surface, thus enabling an increase in the surface area of the dielectric intermediary bonding layer which is primarily relied on for the fusion bonding across the wafer bonding interface.

As previously described, the preferred embodiment of this invention included means to reduce the adverse effects of the differential mismatch in CTE of the bonded wafer material. An alternative embodiment of this invention is a method in which the photonic wafer epitaxial growth is accomplished on substrates having less differential CTE mismatch with the Si based CMOS wafer used to implement the control circuit of the optoelectronics device; such as Si or silicon carbide (SiC, in particular 3C—SiC which has $2.47 \times 10^6$/K at 25° C.). In particular, recent advances in the epitaxial growth of the class of III-V materials known as III-Nitrides material such GaN on Si substrate have demonstrated the feasibility of the epitaxial growth of polar c-plane as well as non-polar m-plane and semi-polar GaN on Si substrate. Silicon is viewed as an attractive substrate for the growth of GaN due to its low cost, availability in large size, good thermal conductivity, and ability to be selectively removed for better light extraction efficiency. Regular c-plane GaN on Si has been explored extensively with considerable success from industrial production point of view. Researches on non-polar or semi-polar GaN grown on Si have been studied by many groups for the last ten years. According to the crystallography study for GaN on Si, the c-plane of the wurtzite crystal is parallel to the cubic crystal (111) plane, and m-plane is parallel to (112) plane. Therefore, the c-plane GaN growth is always initiated from Si (111) facets, and various reports have successfully demonstrated the en-plane GaN on (112) Si, a-plane GaN on (110) Si, semi-polar (11-22) GaN on (113) Si, (1-101) GaN on (001) Si . . . etc, by means of epitaxial lateral over-growth (ELOG) techniques in either MOCVD or HVPE system.

III-Nitrides are essential for the epitaxial growth of blue and green solid state light emitting photonic wafers typically currently grown on sapphire substrates, which have a substantial differential CTE mismatch with Si. When a Si-CTE matched epitaxial growth substrate, such as Si or SiC, is used the relative thermal expansion of the wafers to be bonded would be substantially reduced especially at the elevated temperature of the interconnect via posts interfusion step 280 of FIG. 2 described earlier. Thus the use of Si-CTE matched epitaxial growth substrate of the photonic wafer, in particular GaN on Si, would alleviate the adverse effects caused by the differential CTE mismatch between the substrate of the photonic wafer, especially sapphire, and the Si based CMOS wafer used to implement the control circuit of the optoelectronics device.

Means for Dealing with Wafers Bowing

The second important aspect of bonding of III-V material based photonic wafers to Si based CMOS wafers is the difference in wafer bow of the III-V material based photonic wafers and Si CMOS wafers. Prime silicon wafers have negligible bowing, while photonic wafers especially those based on III-Nitride material such as GaN have a very high bowing (between 40-70 µm on average in a 4" wafer) due to the fact that the lattice constants for III-Nitride material are different from those of the epitaxial growth wafer material (such as sapphire) by a significant amount. This large difference in lattice constant leads to strain build up within the III-V layers and would tend to lead to a high bowing of the photonic wafer.

A significant consequence of the difference in wafer bow between the bonded III-V based photonic and Si based CMOS wafers is that it causes a nullifying stress on the bonding interface between the two wafers. This stress on the bonding interface between the III-V and Si wafers could cause the achieved bonding to be substantially weaker than what is required to support the adequate level of thermal compression required to interfuse the electrical interconnect via posts. Therefore, the typical bowing of the III-V wafer could lead to a substantially weak wafer bonding and will also likely prevent complete interfusion of the electrical interconnect via posts resulting in high electrical interconnect resistance.

Figure 4:
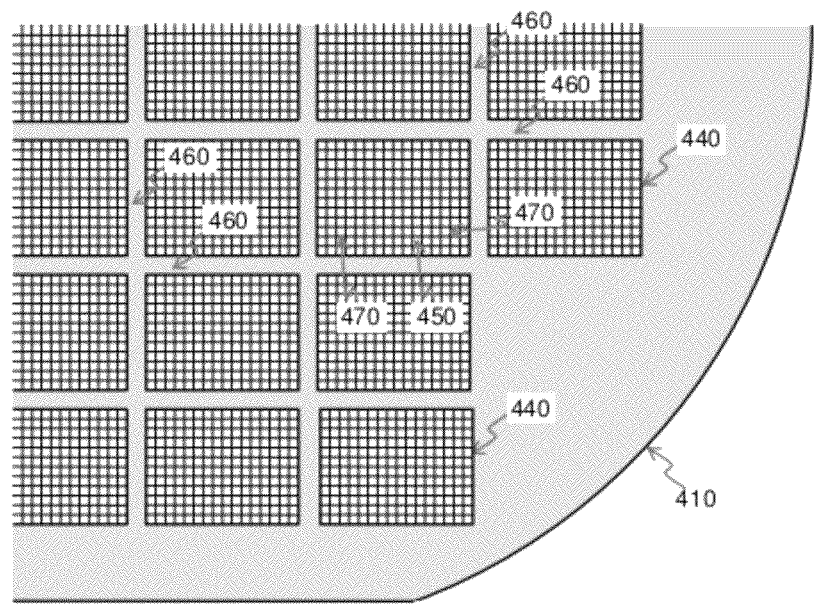
FIG. 4 illustrates the vertical and horizontal cross sectional views of the photonic wafer patterning used to relief the strain and reduce the bowing of photonic wafers bonded using wafer bonding methods of this invention.
Figure 4:
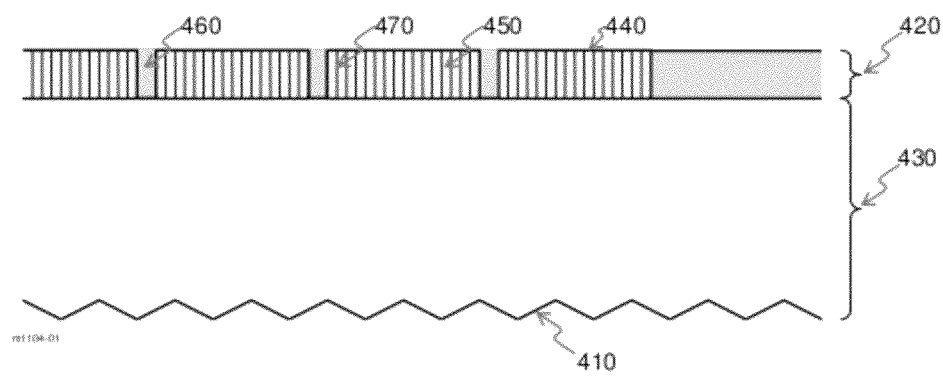

In the preferred embodiment of this invention the photonic layers are deliberately cross etched before the wafers are bonded to relief some of the built-up strain within the photonic layers and consequently reducing the wafer bow. Such a wafer bowing reduction means are illustrated in FIG. 4 which shows the photonic wafer 410 being comprised of the photonic structure epitaxial layers 420 which are grown on top of the substrate 430. FIG. 4 further illustrates the photonic structure epitaxial layers 420 after being lithographically patterned into device dies 440 which are further lithographically patterned into photonic elements (pixels) 450. As illustrated in FIG. 4, the etched inter-die partition 460 (also known as the die street area) as well as the inter-element (inter-pixel) partition 470 are cross etched in two orthogonal directions from the top of the photonic structure epitaxial layers 420 all the way to the top of the substrate 430. For the fabrication of the multiple layers of the ultra high density optoelectronics devices, such as the emissive micro-display device described in U.S. Pat. Nos. 7,623,560, 7,767,479 and 7,829,902, the photonic wafers are typically first etched before bonding to create the photonic element (pixel) array of a single device die whereby etched pixel array pattern pitch is typically ~10 µm or less and the device die pattern pitch is typically ~10 mm or less. In the preferred embodiment of this invention the etching of the photonic layers to create the photonic element (pixel) array and device die patterns is therefore leveraged as a means to relieve the built-up strain within the photonic structure epitaxial layers 420 of the photonic wafers. In this strain relief (or wafer bow reduction) method of the preferred embodiment of this invention the III-V photonic wafers are first etched using plasma inductively coupled plasma reactive ion etching (ICP/RIE) to create the photonic inter-element (pixel) sidewall trenches 470 (or in the case of a typical micro-array devices the micro-emitter mesas) and the inter-die device boundaries 460. In this strain relief (or wafer bow reduction) method of the preferred embodiment of this invention the wafer photonic structure epitaxial layers 420 (which is typically GaN, GaAs or InP based) is etched to create the inter-die and inter-element trenches 460 and 470; respectively, that are deliberately extended, especially between the device die areas (so-called die streets), to reach the surface of the growth substrate 430 (which is typically sapphire when the photonic material is GaN based). After the built-up strain within the photonic layers 320 of the wafer is relieved and the wafer bow is reduced, the etched trenches are passivated with $SiO_2$ and then refilled with the appropriate material which in the case of the inter-pixel trenches 470 could be metal such as nickel (using electro-plating techniques or the like) and in the case of the inter-die trenches 460 could be either $SiO_2$ or $Si_2N_3$ or other appropriate dielectric material. Refilling of the etched trenches can typically be performed using plasma enhanced chemical vapor deposition (PECVD) techniques or the like.

It should be noted that the photonic wafer bow reduction means of this invention described above can also be used in the fabrication of solid state light emitter device such as LED or LD devices other than the emissive micro-display described in U.S. Pat. Nos. 7,623,560, 7,767,479 and 7,829,902 since the fabrication of such devices also typically includes etching of the photonic wafers to delineate the boundaries of the devices mesas. In these cases the photonic wafer bow can be substantially reduced when the etched inert-device trenches are treated in accordance with the method described above. In general, reduction of the photonic wafer bowing is beneficial even if the semiconductor processing of the photonic wafers does not include wafer bonding because the handling of the semiconductor wafers by lithography steppers as well as other semiconductor equipment that relies on optical acquisition of on-wafer alignment marks is typically fairly sensitive to excessive wafer bow.

In summary, this invention introduced semiconductor wafer bonding methods that enable the fabrication of 3D-IC optoelectronics devices in which light as well as electrical signals can be transferred across the bonded layers of the device. The preferred embodiment of this invention includes methods for:

1. Forming optical interconnects as well as electrical interconnect across the dielectric intermediary bonding layers of the wafer;
2. Forming optical guiding interconnects within the dielectric intermediary bonding layers of the wafers;
3. Successively bonding of photonic wafers, which are typically fabricated using III-V material, to form a multi-layer photonic stack that can be bonded to a silicon based control circuit wafer to form an optoelectronic device in which both light as well as electrical signals are transferred across the wafers bonding interface;
4. Alleviating the adverse effects of the mismatch in the coefficient of thermal expansion between the bonded wafers; and
5. Reducing the adverse effects on wafer bonding that could be caused by the wafer bowing typical in photonic wafers.

What is claimed is:

1. A method for the bonding of a III-V semiconductor wafer to a CMOS silicon wafer comprising:
    forming bonding surfaces on the wafers for the transfer of electric signals between the bonded wafers by:
    forming a dielectric intermediary bonding layer on a surface of each wafer, within which surface is embedded electrical interconnects for the transfer of electrical signals; respectively;
    planarizing the surfaces of the dielectric intermediary bonding layers of the two wafers;
    interfusing the electrical interconnects and the dielectric intermediary bonding layer on the wafers to bond the wafers together with electrical interconnections between the wafers;
    wherein the density of the electrical interconnects across the bonding interface is more than one million electrical interconnects per square centimeter;
    wherein the III-V semiconductor wafer is a photonic wafer comprising multiple III-V material layers deposited on an epitaxial growth substrate and cross etched to delineate an array comprising a multiplicity of photonic elements, and further cross etched to delineate the die boundaries of the array.

2. The method of claim 1 wherein the cross etching is done prior to the interfusion.

3. The method of claim 1 wherein each photonic element has a size of 10×10 microns or less.

4. The method of claim 1 wherein the density of the electrical interconnects across the bonding interface is 4 million electrical interconnects per square centimeter or higher.

5. The method of claim 1 wherein the III-V semiconductor wafer is formed in at least one epitaxial layer on an epitaxial growth substrate bonded to act as a host wafer.

6. The method of claim 5 wherein the epitaxial growth substrate is removed after the interfusion using a laser lift-off process, an epitaxial lift-off process or a chemical mechanical polishing lift-off process.

7. The method of claim 1 wherein the III-V material epitaxial layers of the photonic wafer are cross etched in two orthogonal directions through the photonic wafer to form trenches all the way to its epitaxial growth substrate.

8. The method of claim 7 wherein the trenches are refilled with metallic materials or dielectric materials.

9. The method of claim 1 wherein the dielectric intermediary bonding layers are selected to have a coefficient of thermal expansion between the coefficients of thermal expansion of the two wafers.

10. The method of claim 9 wherein the thickness of the dielectric intermediary bonding layers is substantially equal to the height of the electrical interconnects above the surface of the wafers.

11. The method of claim 9 wherein the planarization is controlled to provide a surface of the electrical interconnects slightly below the planarized surfaces of the dielectric intermediary bonding layers.

* * * * *